United States Patent
Park et al.

(10) Patent No.: US 11,842,950 B2
(45) Date of Patent: Dec. 12, 2023

(54) PACKAGE MODULE

(71) Applicant: SAMSUNG ELECTRONICS CO., LTD., Suwon-si (KR)

(72) Inventors: Yongjin Park, Suwon-si (KR); Myungsam Kang, Suwon-si (KR); Younggwan Ko, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 17/685,227

(22) Filed: Mar. 2, 2022

(65) Prior Publication Data

US 2022/0246506 A1 Aug. 4, 2022

Related U.S. Application Data

(63) Continuation of application No. 16/590,570, filed on Oct. 2, 2019, now abandoned.

(30) Foreign Application Priority Data

Nov. 29, 2018 (KR) .................... 10-2018-0151366

(51) Int. Cl.
*H01L 23/495* (2006.01)
*H01L 23/00* (2006.01)
(Continued)

(52) U.S. Cl.
CPC .... *H01L 23/49534* (2013.01); *H01L 23/3157* (2013.01); *H01L 23/49531* (2013.01);
(Continued)

(58) Field of Classification Search
CPC ... H01L 2224/81; H01L 2224/023–024; H01L 24/10–17; H01L 23/488–49894;
(Continued)

(56) References Cited

U.S. PATENT DOCUMENTS 7,687,899 B1 3/2010 Berry
8,208,268 B2 6/2012 Kajiki
(Continued)

FOREIGN PATENT DOCUMENTS

KR  10-1362715 B1  2/2014

OTHER PUBLICATIONS

Communication dated Sep. 26, 2023 by the China Intellectual Property Office in counterpart Chinese Patent Application No. 201911170738.1.

*Primary Examiner* — Vincent Wall
(74) *Attorney, Agent, or Firm* — Sughrue Mion, PLLC

(57) ABSTRACT

A package module includes a connection structure including one or more redistribution layers, a semiconductor chip disposed on the connection structure and having a connection pad electrically connected to the one or more redistribution layers, a plurality of electronic components disposed on the connection structure and electrically connected to the one or more redistribution layers, one or more frames disposed on the connection structure, and an encapsulant disposed on the connection structure, and respectively covering at least portions of the semiconductor chip, the plurality of electronic components, and the one or more frames. At least a portion of an outer side surface of the encapsulant is coplanar on the same level as at least a portion of an outer side surface of at least one of the one or more frames.

20 Claims, 27 Drawing Sheets

(51) Int. Cl.
  *H01L 23/31* (2006.01)
  *H01L 23/522* (2006.01)
(52) U.S. Cl.
  CPC .... *H01L 23/49537* (2013.01); *H01L 23/5226* (2013.01); *H01L 24/09* (2013.01); *H01L 2224/02372* (2013.01); *H01L 2224/02377* (2013.01); *H01L 2224/02379* (2013.01)
(58) Field of Classification Search
  CPC . H01L 25/16; H01L 25/0652; H01L 25/0655; H01L 25/071; H01L 25/072
  See application file for complete search history.

(56) References Cited

U.S. PATENT DOCUMENTS

| | | | |
|---|---|---|---|
| 8,890,628 | B2 | 11/2014 | Nair |
| 10,026,678 | B1 * | 7/2018 | Cho ........................ H01L 24/20 |
| 2005/0205996 | A1 | 9/2005 | Usui |
| 2006/0128069 | A1 | 6/2006 | Hsu |
| 2007/0246806 | A1 | 10/2007 | Ong |
| 2008/0079163 | A1 | 4/2008 | Kurita |
| 2008/0246126 | A1 | 10/2008 | Bowles |
| 2008/0308950 | A1 | 12/2008 | Yoo |
| 2010/0133682 | A1 | 6/2010 | Meyer |
| 2010/0244208 | A1 | 9/2010 | Pagaila |
| 2011/0140283 | A1 | 6/2011 | Chandra |
| 2012/0286419 | A1 | 11/2012 | Kwon |
| 2014/0134804 | A1 | 5/2014 | Kelly |
| 2015/0084206 | A1 | 3/2015 | Lin |
| 2015/0318246 | A1 | 11/2015 | Yu |
| 2015/0325509 | A1 | 11/2015 | We |
| 2016/0338202 | A1 | 11/2016 | Park |
| 2017/0287825 | A1 | 10/2017 | Lee |
| 2018/0033770 | A1 | 2/2018 | Hsu |
| 2018/0145033 | A1 | 5/2018 | Yi et al. |
| 2018/0240729 | A1 | 8/2018 | Kim |
| 2018/0286790 | A1 | 10/2018 | Cho |
| 2019/0013300 | A1 | 1/2019 | Baek |
| 2020/0152569 | A1 | 5/2020 | Lee |
| 2020/0161202 | A1 | 5/2020 | Lee |
| 2020/0161237 | A1 | 5/2020 | Cho |
| 2020/0176364 | A1 | 6/2020 | Park |
| 2020/0185357 | A1 | 6/2020 | Byun |
| 2020/0312797 | A1 | 10/2020 | Kang |

* cited by examiner

VIII-VIII'

PACKAGE MODULE

CROSS-REFERENCE TO RELATED APPLICATION(S)

This application is a continuation of U.S. application Ser. No. 16/590,570, filed Oct. 2, 2019, which claims the benefit under 35 USC 119(a) of Korean Patent Application No. 10-2018-0151366 filed on Nov. 29, 2018 in the Korean Intellectual Property Office, the entire disclosure of which is incorporated herein by reference for all purposes.

BACKGROUND

The present disclosure relates to a package module in which a plurality of electronic components and semiconductor chips are embedded in a single package.

To cope with market demand demanding thinning, multifunctionalization and high performance of smartphones, it is required for semiconductor chips and semiconductor packages to have fine, lightweight, high density shortened circuits, and the like. To this end, the fabrication technology of semiconductor packages is rapidly developing. For example, a chip scale package (CSP) has been developed in accordance with such market demand, and semiconductor package related technologies, such as package on package (POP), through silicon via (TSV), fan-out wafer level package (FO-WLP) and or the like, are being developed. Of these, the FO-WLP technology has the advantage of increasing integration density of connections between semiconductor chips and a substrate and of improving thermal and electrical characteristics, while using an existing semiconductor process as is.

On the other hand, the number of I/Os of semiconductor chips has been greatly increased to cope with the multifunctionalization and high performance of smartphones, and the technologies in which a large number of semiconductor chips and/or passive components may be mounted to perform a plurality of functions in one package are being developed. However, since FO-WLP may package only one semiconductor chip, there is a limit to meeting market demand that requires packaging of a large number of semiconductor chips.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

An aspect of the present disclosure is to provide a novel-type package module in which thinning and miniaturization may be implemented, even when a large number of electronic components and semiconductor chips are included, the degree of integration may be increased, and a problem such as undulation or component shift may be prevented, thereby improving yield.

An aspect of the present disclosure is to mount and package a semiconductor chip together with one or more electronic components in a package to modularize the package in such manner that at least a portion of an outer side surface of a package module has a heterogeneous surface.

According to an aspect of the present disclosure, a package module includes a connection structure including one or more redistribution layers, a semiconductor chip disposed on the connection structure and having a connection pad electrically connected to the one or more redistribution layers, a plurality of electronic components disposed on the connection structure and electrically connected to the one or more redistribution layers, one or more frames disposed on the connection structure, and an encapsulant disposed on the connection structure, and respectively covering at least portions of the semiconductor chip, the plurality of electronic components, and the one or more frames. At least a portion of an outer side surface of the encapsulant is coplanar on the same level as at least a portion of an outer side surface of at least one of the one or more frames.

According to an aspect of the present disclosure, a package module includes a core structure including a plurality of electronic components, a plurality of frames, and a first encapsulant covering at least a portion of each of the plurality of electronic components and each of the plurality of frames, the core structure including a penetration portion passing through the first encapsulant; a semiconductor chip disposed in the penetration portion and including a connection pad; a second encapsulant covering at least a portion of each of the core structure and the semiconductor chip, the second encapsulant filling at least a portion of the penetration portion; and a connection structure disposed on the core structure and on a surface of the semiconductor chip on which the connection pad is disposed, the connection structure including one or more redistribution layers electrically connected to the plurality of electronic components and the connection pad.

According to an aspect of the present disclosure, a package module includes: a connection structure; a core structure disposed on the connection structure, and including a first encapsulant, and a plurality of frames and a plurality of electronic components dispersed in the first encapsulant; a semiconductor chip disposed on the connection structure and including a redistribution layer; and a second encapsulant covering at least a portion of each of the core structure and the semiconductor chip and separating the semiconductor chip and the core structure from each other. An outer side surface of one of the plurality of frames, an outer side surface of the first encapsulant, and an outer side surface of the second encapsulant are substantially coplanar with each other.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
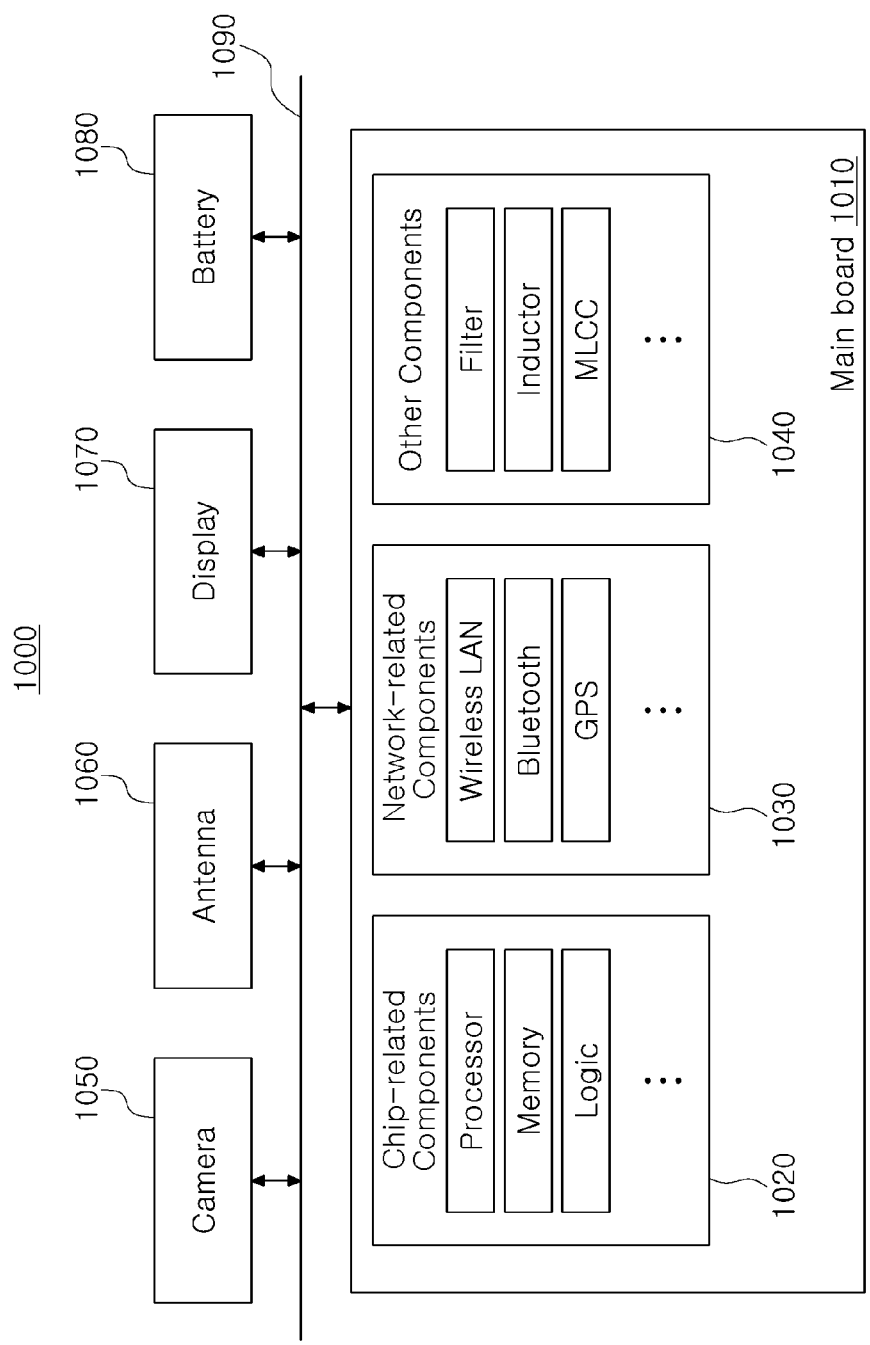
FIG. 1 is a schematic block diagram illustrating an example of an electronic device system.

Hereinafter, examples of the present disclosure will be described with reference to the accompanying drawings. The shape and size of constituent elements in the drawings may be exaggerated or reduced for clarity.

Electronic Device

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
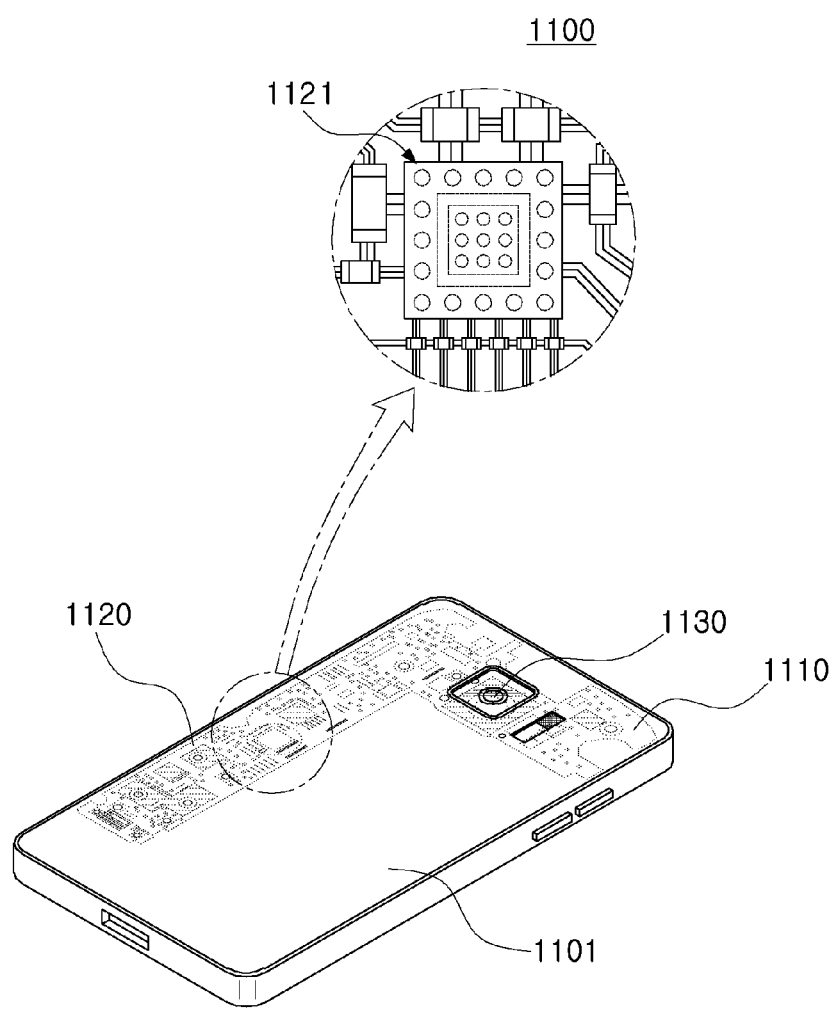
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the motherboard 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

In this case, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3B:
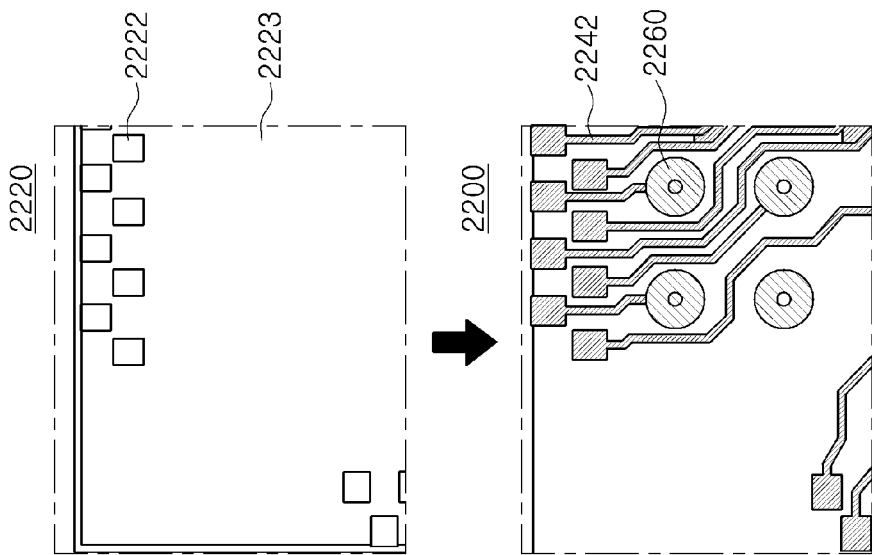
FIGS. 3A and 3B are schematic cross-sectional views illustrating states of a fan-in semiconductor package before and after being packaged.
Figure 3A:
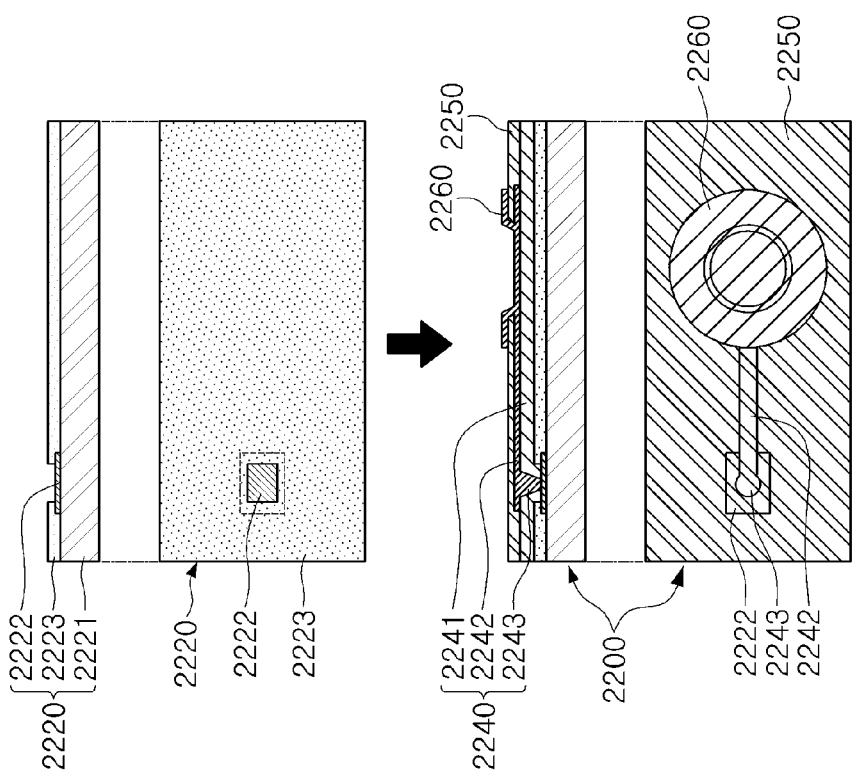

FIGS. 3A and 3B are schematic cross-sectional top views illustrating states of a fan-in semiconductor package before and after being packaged.

Figure 4:
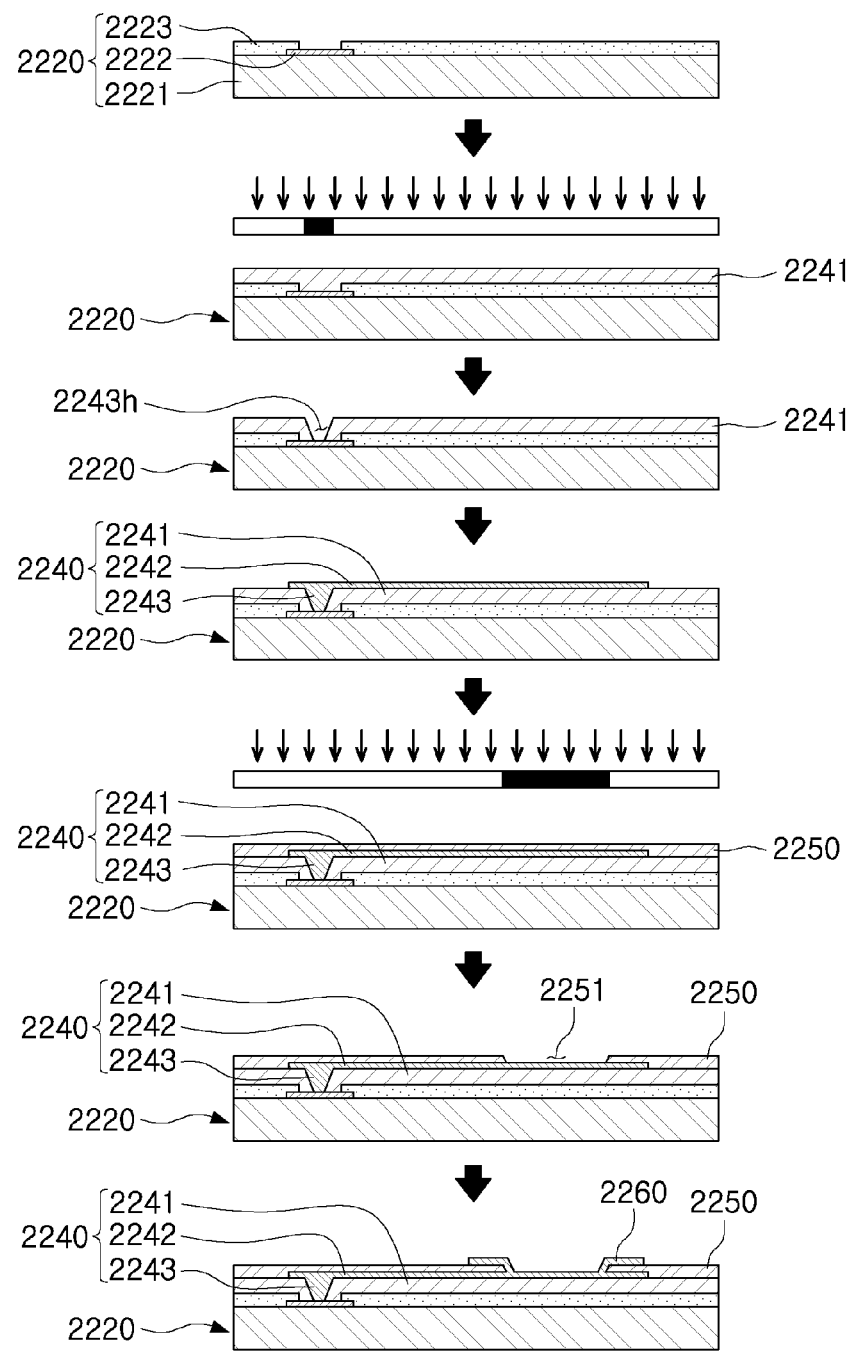
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3A to 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 to redistribute the connection pads 2222. The connection member 2240 may be formed by forming an insulating layer 2241 on the semiconductor chip 2220 using an insulating material such as a photoimageable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even though a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip are not enough to directly mount the fan-in semiconductor package on the mainboard of the electronic device.

Figure 5:
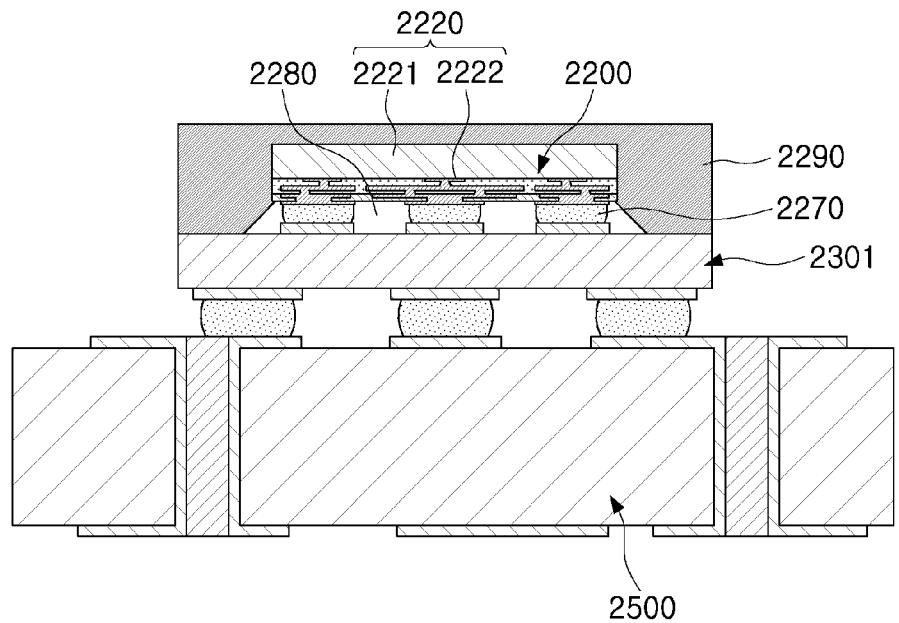
FIG. 5 is a schematic cross-sectional view illustrating a case in which a fan-in semiconductor package is mounted on a printed circuit board and is ultimately mounted on a mainboard of an electronic device.

FIG. 5 is a schematic cross-sectional view illustrating a case in which a fan-in semiconductor package is mounted on a printed circuit board (PCB) substrate and is ultimately mounted on a mainboard of an electronic device.

Figure 6:
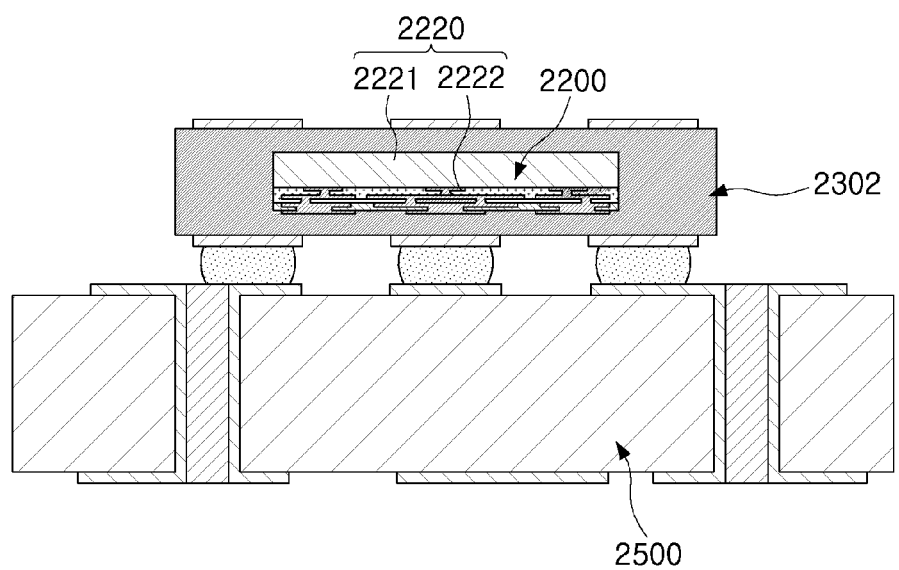
FIG. 6 is a schematic cross-sectional view illustrating a case in which a fan-in semiconductor package is embedded in a printed circuit board and is ultimately mounted on a mainboard of an electronic device.

FIG. 6 is a schematic cross-sectional view illustrating a case in which a fan-in semiconductor package is embedded in a printed circuit board (PCB) and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through a printed circuit board 2301, and the fan-in semiconductor package 2200 may be ultimately mounted on a mainboard 2500 of an electronic device in a state in which it is mounted on the PCB 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate PCB 2302, connection pads 2222, that is, I/O terminals, of the semiconductor chip 2220 may be redistributed by the PCB 2302 in a state in which the fan-in semiconductor package 2200 is embedded in the PCB 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate PCB and be then mounted on the mainboard of the electronic device through a packaging process or may be mounted and used on the mainboard of the electronic device in a state in which it is embedded in the PCB.

Fan-Out Semiconductor Package

Figure 7:
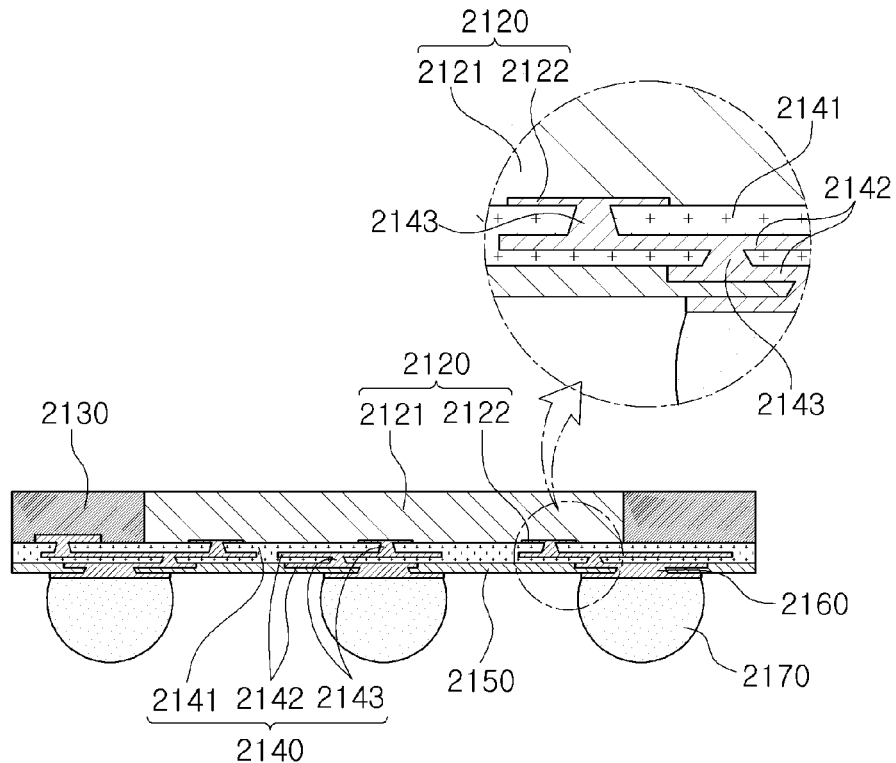
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the mainboard of the electronic device without using a separate PCB, as described below.

Figure 8:
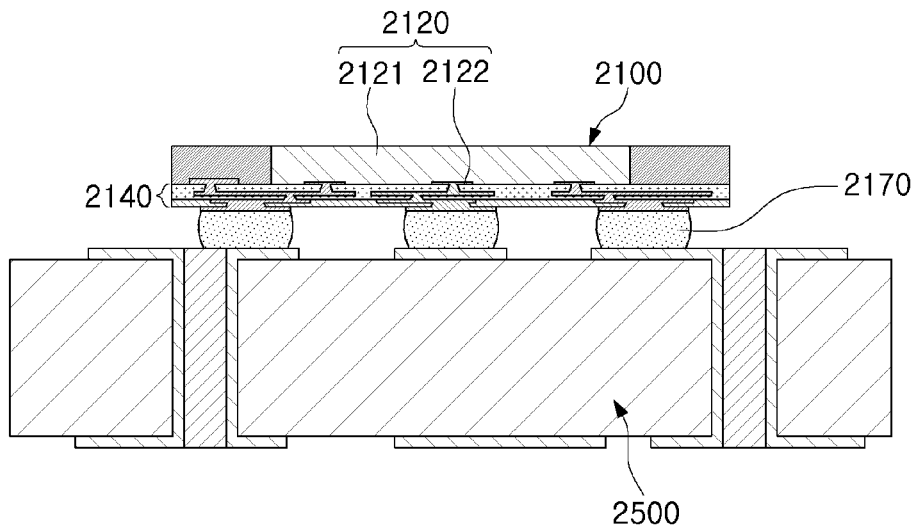
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate PCB, or the like.

As described above, since the fan-out semiconductor package may be mounted on the mainboard of the electronic device without using the separate printed circuit board, the fan-out semiconductor package may be implemented at a thickness lower than that of the fan-in semiconductor package using the printed circuit board. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as a PCB, or the like, having a scale, a purpose, and the like, different from those of the fan-out semiconductor package, and having the fan-in semiconductor package embedded therein.

Hereinafter, a novel-type package module, in which thinning and miniaturization may be implemented even when a large number of electronic components and semiconductor chips are included, the degree of integration may be increased, and a problem such as undulation or component shift may be prevented, improving a yield, will be described with reference to the accompanying drawings.

Package Module

Figure 9:
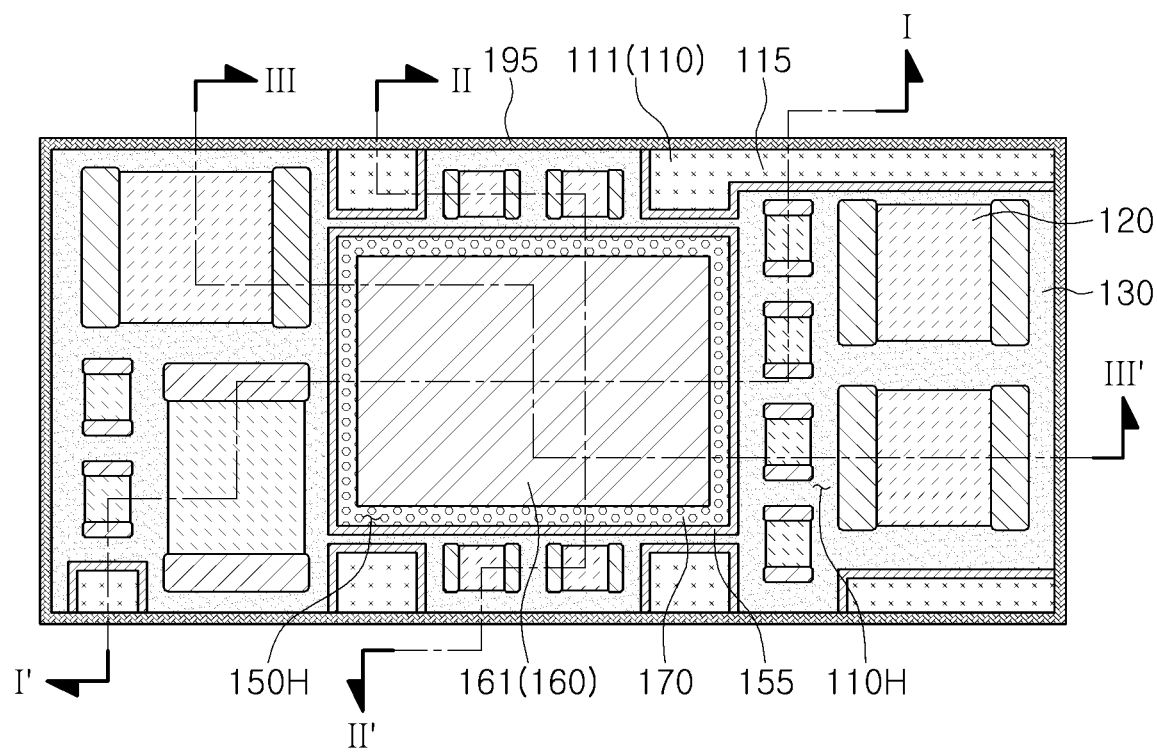
FIG. 9 is a plan view schematically illustrating an example of a package module.

FIG. 9 is a plan view schematically illustrating an example of a package module.

Figure 10:
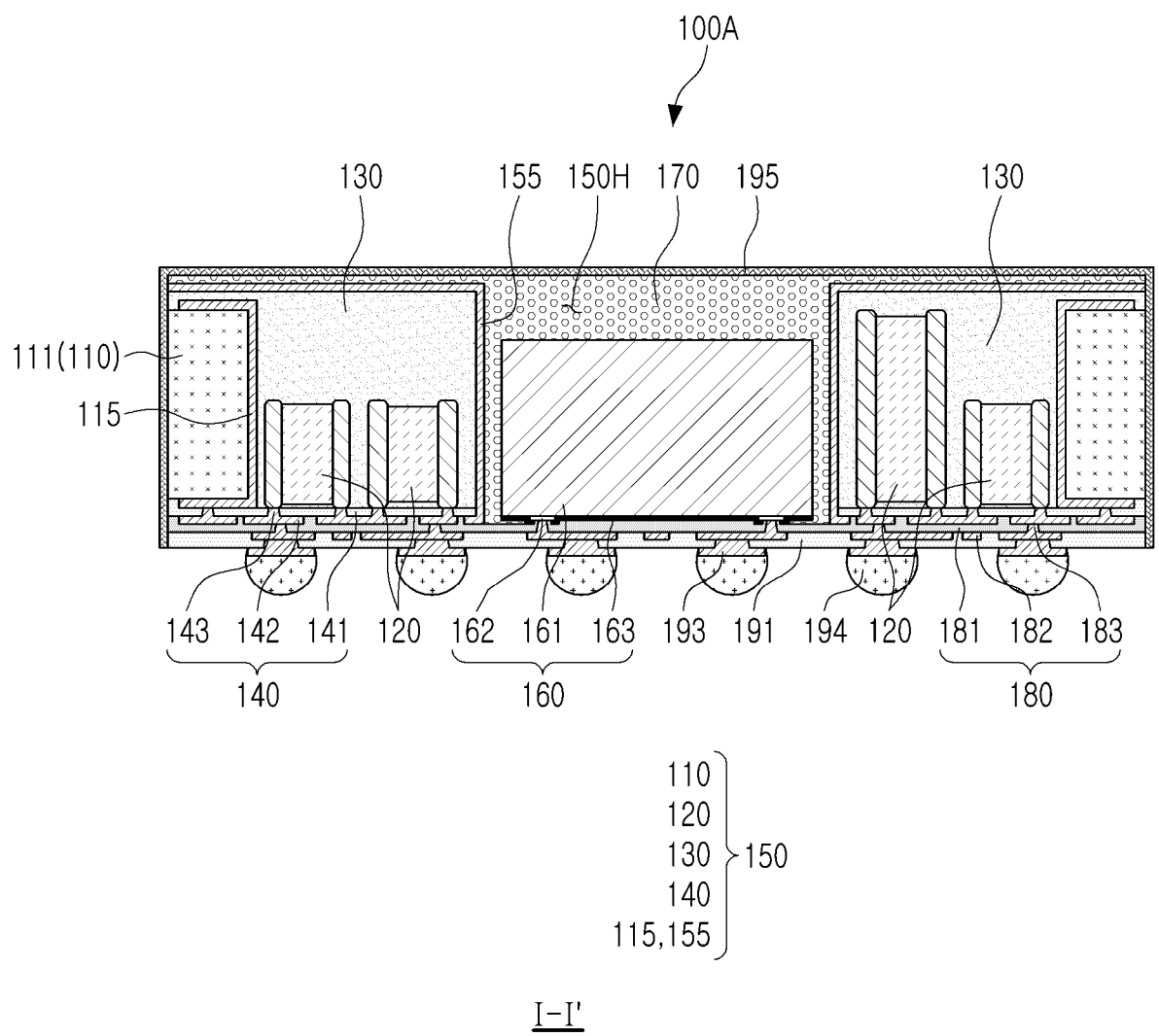
FIG. 10 is a schematic cross-sectional view of the package module, taken along line I-I' of FIG. 9.

FIG. 10 is a schematic cross-sectional view of the package module, taken along line I-I' of FIG. 9.

Figure 11:
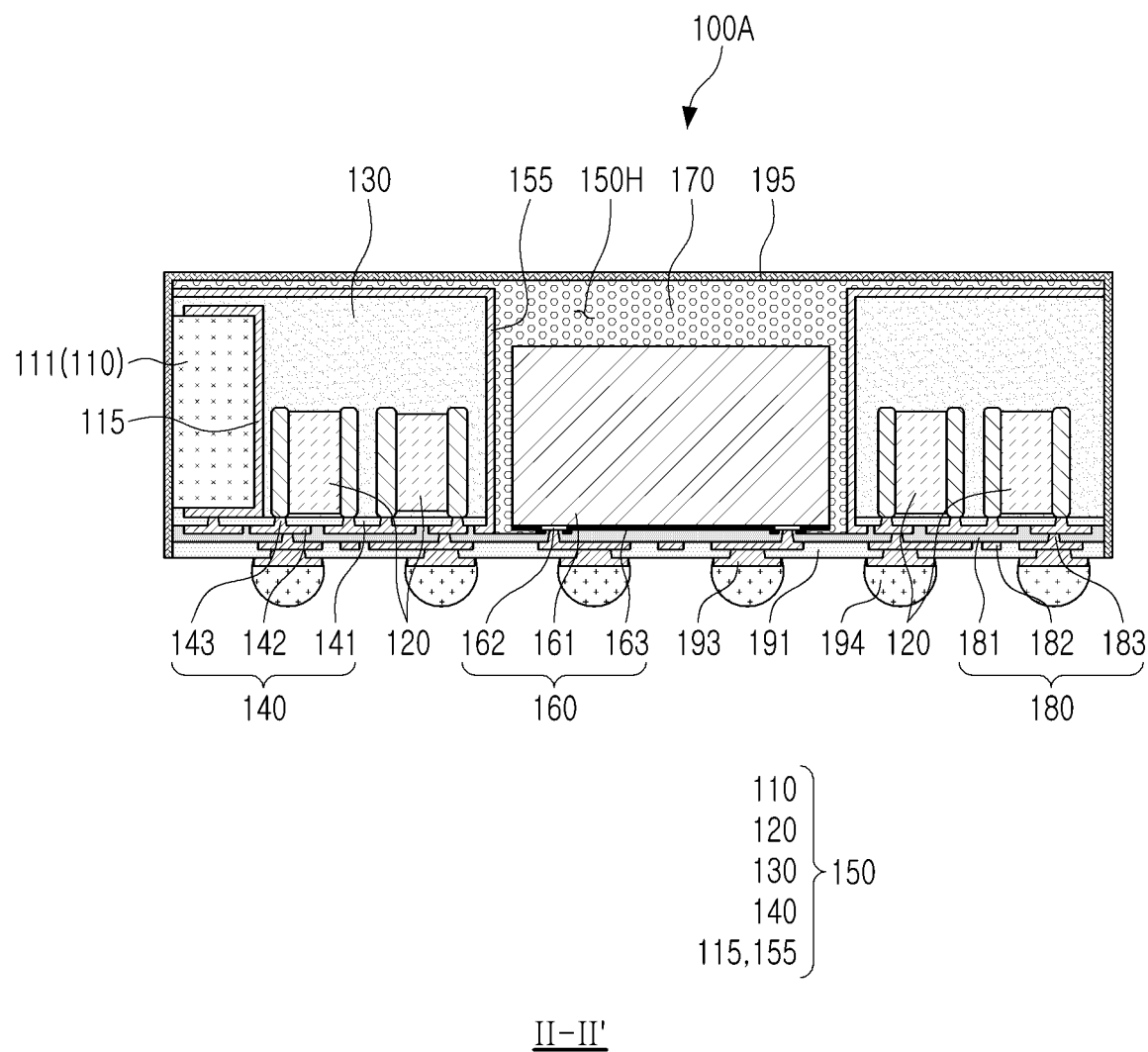
FIG. 11 is a schematic cross-sectional view of the package module, taken along line II-II' of FIG. 9.

FIG. 11 is a schematic cross-sectional view of the package module, taken along line II-II' of FIG. 9.

Figure 12:
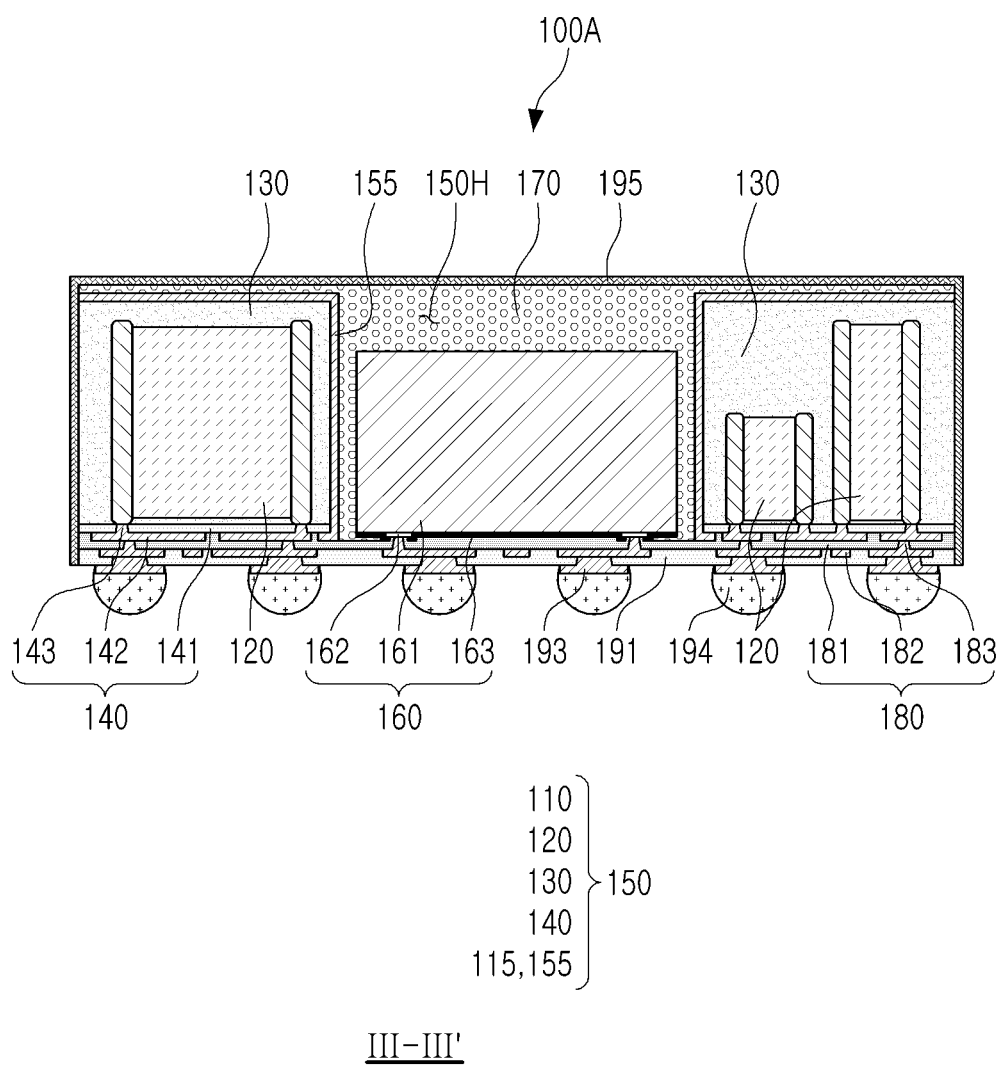
FIG. 12 is a schematic cross-sectional view of the package module, taken along line III-III' of FIG. 9.

FIG. 12 is a schematic cross-sectional view of the package module, taken along line of FIG. 9.

Figure 29:
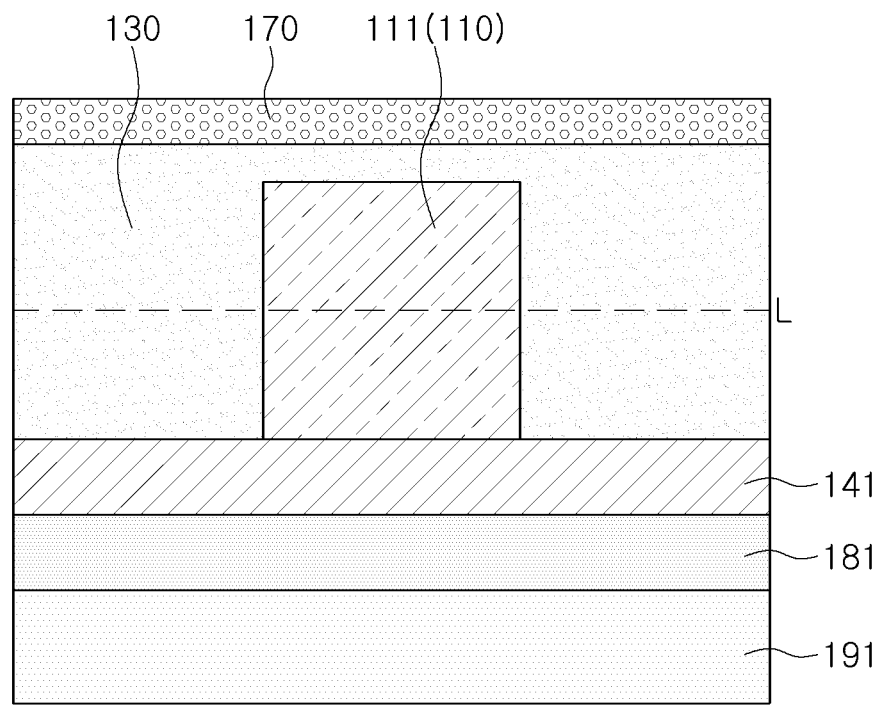
FIG. 29 is a cross-sectional view schematically illustrating a heterogeneous surface of a package module.

With reference to the drawings described above, a package module 100A according to an example includes a connection structure 180 that includes one or more redistribution layers 182, a semiconductor chip 160 disposed on the connection structure 180 and having a connection pad 162 electrically connected to one or more redistribution layers 182, a plurality of electronic components 120 disposed on the connection structure 180 and electrically connected to one or more redistribution layers 182, one or more frames 110 disposed on the connection structure 180, and encapsulants 130 and 170 disposed on the connection structure 180 and covering at least a portion of each of the semiconductor chip 160, the plurality of electronic components 120 and the one or more frames 110. In this case, as illustrated in FIG. 29 in an example, at least a portion of outer side surfaces of the encapsulants 130 and 170 is disposed on the same level (L) as at least a portion of an outer side surface of at least one of the one or more frames 110, to be coplanar therewith.

As described above, the package module 100A according to an example includes one or more frames 110 together with the electronic component 120. For example, in the case of the package module 100A according to an example, a through hole 110H is formed in the frame 110 at a panel level, and the plurality of electronic components 120 and the semiconductor chip 160 are disposed in the through hole 110H to be packaged by the encapsulants 130 and 170, and then the frame 110 is removed through a process such as singulation, in such a manner that a portion of the frame 110 may remain in the formation of the through-hole 110H. For example, the through hole 110H is not simply formed in a planar quadrangular shape, but is designed such that one or more frames 110 may remain locally. In this case, as will be described later, when the electronic components 120 are sealed with the first encapsulant 130, voids are eliminated to prevent undulation from occurring on the outer surface of the package module 100A, and further, the electronic components 120 are prevented from being shifted in the sealing process. Thus, in the absence of the frame 110 in some regions, the yield of the contrast process may be increased.

To locally retain the frame 110 as described above, a cut surface by singulation should be composed of the outer side surface of the encapsulants 130 and 170 and the outer side surface of the remaining frame 110. Thus, the outer side surface of the encapsulant 130 and 170, more in detail, at least a portion of the outer side surface of the first encapsulant 130 may be disposed on the same level as at least a portion of the outer side surface of at least one of the one or more frames 110, to be coplanar therewith. In this case, the same level indicates that they are located on substantially the same level, and includes not only completely the same level but also almost the same level due to process errors and the like. In addition, coplanar indicates substantially coplanar, and is a concept including not only making coplanar but also almost coplanar due to process errors and the like.

In the case of the package module 100A according to an example, the encapsulant includes the first encapsulant 130 covering at least a portion of each of the one or more frames 110 and the plurality of electronic components 120, and the second encapsulant 170 covering at least a portion of each of the semiconductor chip 160 and the first encapsulant 160. The through portion 150H is formed in the first encapsulant 130. The semiconductor chip 160 is disposed in the through portion 150H, and the second encapsulant 170 fills at least a portion of the through portion 150H. For example, the package module 100A according to an example includes the plurality of electronic components 120, a plurality of frames 110, the first encapsulant 130 covering at least a portion of each of the plurality of frames 110 and the plurality of electronic components 120, and includes a core structure 150 having the through portion 150H penetrating through the first encapsulant 130. The core structure 150 is first formed, and then, the semiconductor chip 160 is disposed in the through portion 150H, to then be sealed by the second encapsulant 170. Then, the connection structure 180 is formed on the core structure 150 and the semiconductor chip 160. The package module 100A may be manufactured through the processes as described above.

Figure 30:
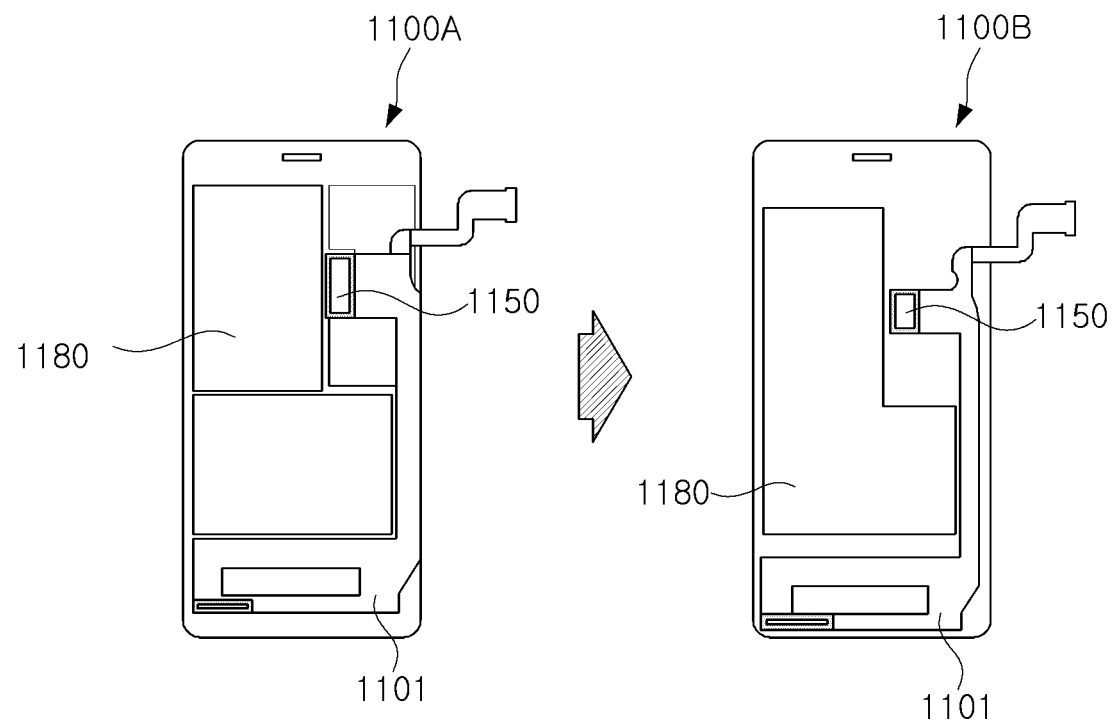
FIG. 30 schematically illustrates an effect of a package module.

In the package module 100A according to the example as described above, the plurality of electronic components 120 are embedded in the core structure 150, and separately therefrom, the semiconductor chip 160 is disposed in the through portion 150H penetrating through the core structure 150, thereby obtaining a compact design while forming respective blocks capable of distinguishing between different types of parts. Therefore, thinning and miniaturization of the device may be implemented even when many parts and chips are included. In detail, since the plurality of electronic components 120 and the semiconductor chip 160 are disposed together in a single package and are modularized, the interval between the chip and the components may be significantly reduced, and as shown in the example of FIG. 30, the mounting area on a printed circuit board such as a main board may be significantly reduced. In addition, since the electrical path between the semiconductor chip 160 and the plurality of electronic components 120 may be significantly reduced, occurrence of noise problem may be prevented. In addition, the sealing processes 130 and 170 of two or more steps, in which the plurality of electronic components 120 are first sealed with the first encapsulant 130, and then, the semiconductor chip 160 is sealed with the second encapsulant 170, are performed. As such, it may significantly reduce a yield-related problem of the semiconductor chip 160 due to poor mounting of the plurality of electronic components 120 and reduce an influence of foreign matter on the semiconductor chip 160, occurring during the mounting process of the plurality of electronic components 120.

The core structure 150 may include a wiring member 140 including a wiring layer 142 capable of first redistributing the plurality of the electronic components 120. Thereafter, the penetration portion 150H penetrating through the core structure 150 and the wiring member 140 thereon is formed, thereby introducing the semiconductor chip 160. As described above, in the case in which the wiring member 140 is separately introduced into the core structure 150, a material of the insulating layer 141 of the wiring member 140 may be selected independently of the semiconductor chip 160. For example, a non-photoimageable dielectric material including an inorganic filler, which is not a photoimageable dielectric (PID) material, for example, Ajinomoto Build-up Film (ABF) or the like may be used as a material of the insulating layer 141. This film type of non-photoimageable dielectric material is excellent in terms of flatness, and therefore, problems of undulation and cracking caused by protruding electrodes of the electronic component 120 may be prevented. Also, in the case of the non-photoimageable dielectric material, an opening is formed using a laser via. Even in a case in which the material of the first encapsulant 130 bleeds into the electrode of the electronic components 120, the electrode may be effectively exposed through the laser via. Therefore, occurrence of a problem caused by an electrode exposure relevant defect may be prevented. In addition, the wiring member 140 may be formed before the semiconductor chip 160 is disposed, and has an advantage in that the yield of the semiconductor chip 160 may not be affected. In this case, a non-photoimageable dielectric (PID) material may be used as a material of the insulating layer 181 of the connection structure 180. In this case, since a fine pitch may be introduced through a photovia, tens to millions of the connection pads 162 of the semiconductor chip 160 may be effectively redistributed as in the normal case. For example, a material of the insulating layer 181 in which the wiring layer 142 and a wiring via 143 are formed, and a material of the insulating layer 181 in which the redistribution layer 182 and a connection via 183 may be selectively controlled, thereby exhibiting an excellent synergy effect.

Since the wiring member 140 may be introduced into the core structure 150 separately before the formation of the penetration portion 150H in which the semiconductor chip 160 is disposed, a bottom surface of the penetration hole 110H may be stepped from a bottom surface of the penetration portion 150H, and thus, contact surfaces of the wiring members 140 of the plurality of electronic components 120 may be stepped from the active surface of the semiconductor chip 160. For example, the active surface of the semiconductor chip 160 may be located on a level lower than the surface of each of the plurality of electronic components 120 in contact with the wiring member 140, with respect to the inactive surface of the semiconductor chip 160. For example, the wiring member 140 may be separately introduced into the core structure 150 before the formation of the through portion 150H in which the semiconductor chip 160 is disposed, thereby providing structural characteristics different from a package module structure of the related art.

On the other hand, first and second metal layers 115 and 155 may be disposed on an inner side surface of each of the frames 110 and a wall surface of the through portion 150H, respectively. In this case, mutual interference of electromagnetic waves between different types of blocks may be effectively blocked, and a heat radiation effect may also be improved. The first and second metal layers 115 and 155 may respectively extend to at least one surface of the frame 110 and the first encapsulant 130, respectively. In an example, a metal film 195 may be disposed to cover on an upper surface of the second encapsulant 170, an outer side surface of the second encapsulant 170, an outer side surface of the first encapsulant 130, an outer side surface of each of the one or more frames 110, and an outer side surface of the connection structure 180. In this case, in the case of the package module 100A, electromagnetic wave shielding and heat radiating effects may be improved as a whole.

Hereinafter, components of the package module 100A will be described in detail with reference to the drawings.

The one or more frames 110 may be locally disposed on substantially the same level as the plurality of electronic components 120, for example, in empty space to prevent surface undulation, and also to prevent a shift of the plurality of electronic components 120. The one or more frames 110 may be spaced apart from each other and may improve the rigidity of the package module 100A according to a detailed material of respective insulating layers 111, and may serve to secure thickness uniformity of the first encapsulant 130. The number of the one or more frames 110 is not particularly limited, and may be designed according to the required number to constitute at least a portion of the outside of the package 100A in which the metal film 195 is locally formed, or may also be further designed according to empty space between the electronic components 120. In an example, one or more frames 110 each include only one insulating layer 111, but an example thereof is not limited thereto.

The material of the insulating layer 111 is not particularly limited. For example, an insulating material may be used. As the insulating material, a thermosetting resin such as an epoxy resin, a thermoplastic resin such as polyimide, or a resin in which these resins are impregnated with a core material such as a glass fiber, a glass cloth, a glass fabric, or the like together with an inorganic filler, for example, a prepreg resin, Ajinomoto Build-up Film (ABF) resin, FR-4 resin, Bismaleimide Triazine (BT) resin, or the like, may be used.

The plurality of the electronic components 120 are disposed around the penetration portion 150H in which the semiconductor chip 160 is disposed. The plurality of electronic components 120 may be known passive components such as capacitors and inductors, or the like, but an example thereof is not limited thereto, and may include an integrated circuit die (IC die) as required. The plurality of electronic components 120 may be electrically connected to the connection pad 162 of the semiconductor chip 160 through the wiring layer 142 of the wiring member 140 and the redistribution layer 182 of the connection structure 180. The number of the plurality of electronic components 120 is not particularly limited. The sizes of the plurality of electronic components 120 may be the same or different.

The first encapsulant 130 is a structure for protecting the one or more frames 110 and the plurality of electronic components 120 and providing an insulating region. The sealing form is not particularly limited, and may cover at least a portion of each of the one or more frames 110 and each of the plurality of electronic components 120, and may fill at least a portion of space therebetween. A detailed material of the first encapsulant 130 is not particularly limited. For example, ABF or a Photo Imageable Encapsulant (PIE) may be used, but an example thereof is not limited thereto.

The wiring member 140 may include the insulating layer 141 disposed on sides of the one or more frames 110 and the plurality of electronic components 120, facing the connection structure 180, the wiring layer 142 disposed on the insulating layer 141, and the wiring via 143 penetrating through the insulating layer 141 and electrically connecting the wiring layer 142 and the electronic component 120 to each other. The wiring member 140 may include a larger number of the insulating layers 141, the wiring layers 142 and the wiring vias 143 than those illustrated in the drawing.

As the material of the insulating layer 141, an insulating material may be used. In this case, a non-photoimageable dielectric material such as ABF may be used as the insulating material. For example, the insulating layer 141 may be a non-photoimageable dielectric layer. In the case in which the insulating layer 141 is provided as multiple layers, the multiple layers may be integrated according to the process, and the boundaries therebetween may be unclear.

The wiring layer 142 may serve to primarily redistribute the electronic component 120. The wiring layer 142 may be formed of a metal such as copper (Cu), aluminum (Al), silver (Ag), tin (Sn), nickel (Ni), lead (Pb), titanium (Ti), or alloys thereof. The wiring layer 142 may perform various functions according to the design of a relevant layer. For example, the wiring layer 142 may include a ground (GrouND: GND) pattern, a power (PoWeR: PWR) pattern, a signal (Signal: S) pattern. In this case, the signal S pattern includes various signals except for the ground (GND) pattern, the power (PWR) pattern, and the like, for example, a data signal or the like. The ground (GND) pattern and the power (PWR) pattern may also be configured to have the same pattern. In addition, the wiring layer 142 may include various via pads and the like.

The wiring via 143 electrically connects the wiring layer 142, the electronic components 120 and the like, formed on different layers, thereby forming an electrical path in the core structure 150. The wiring via 143 may be formed of a metal material such as copper (Cu), aluminum (Al), silver (Ag), tin (Sn), gold (Au), nickel (Ni), lead (Pb), titanium (Ti), or alloys thereof. The wiring via 143 may be of a filled type via entirely filled with a metal material, or may be a conformal type via formed as a metal material is formed along a wall surface of a via hole. Further, the wiring via 143 may have a tapered shape. The wiring via 143 may include vias for signals, vias for ground and/or power, and the like.

The first metal layer 115 is disposed on the inner side surface of each of the frames 110 and extends to at least one surface of each of the frames 110, for example, the upper and lower surfaces. The first metal layer 115 may completely cover the inner side surface of each of the frames 110, and in this case, may have a further improved electromagnetic wave shielding and heat radiating effect. The first metal layer 115 may include a metal material such as copper (Cu), aluminum (Al), silver (Ag), tin (Sn), gold (Au), nickel (Ni), lead (Pb), titanium (Ti), alloys thereof, or the like. The first metal layer 115 may be electrically connected to the ground pattern of the wiring layer 142 and/or the redistribution layer 182 to be used as a ground plane.

The second metal layer 155 is disposed on the wall surface of the penetration portion 150H and extends to one surface of the first encapsulant 130, for example, an upper surface thereof. The second metal layer 155 may entirely cover the wall surface of the penetration portion 150H, and may consequently completely surround the side surface of the semiconductor chip 160. The second metal layer 155 may extend to cover the upper surface of the first encapsulant 130, and thus, the second metal layer 155 may also cover the electronic components 120. The second metal layer 155 may extend to contact with a portion of the metal film 195 disposed on a side surface of the package module 100A. In this case, the second metal layer 155 may have further improved electromagnetic wave shielding and heat radiating effect. The second metal layer 155 may also include a metal material such as copper (Cu), aluminum (Al), silver (Ag), tin (Sn), gold (Au), nickel (Ni), lead (Pb), titanium (Ti), alloys thereof, or the like. The second metal layer 155 may also be electrically connected to the ground pattern of the wiring layer 142 and/or the redistribution layer 182 to serve as a ground plane.

The semiconductor chip 160 may be a bare integrated circuit (IC) in which hundreds to millions of devices are integrated in a single chip, and may be a packaged integrated circuit (IC) as required. The integrated circuit (IC) may be, for example, a power management integrated circuit (PMIC), a radio frequency integrated circuit (RFIC), or the like, but is not limited thereto. For example, the integrated circuit may be a memory die such as a volatile memory (for example, a dynamic random access memory (DRAM)), a non-volatile memory (for example, a read only memory (ROM)), a flash memory, or the like; an application processor die such as a central processor (for example, a central processing unit (CPU)), a graphics processor (for example, a graphics processing unit (GPU)), a digital signal processor, a cryptographic processor, a microprocessor, a microcontroller, or the like; or a logic die such as an analog-to-digital (ADC) converter, an application-specific integrated circuit (ASIC), or the like.

The semiconductor chip 160 may include a body 161 in which various circuits are formed. The connection pad 162 may be formed on the active surface of the body 161. The body 161 may be formed based on, for example, an active wafer. In this case, silicon (Si), germanium (Ge), gallium arsenide (GaAs) or the like may be used as the base material. The connection pad 162 is used to electrically connect the semiconductor chip 160 to other components. The connection pad 162 may be formed of a metal material, in detail, copper (Cu) or aluminum (Al), but a material thereof is not limited thereto. In the case of the semiconductor chip 160, a surface on which the connection pad 162 is disposed is an active surface and a surface opposed thereto is an inactive surface. A passivation film 163 composed of an oxide film and/or a nitride film having a groove exposing at least a portion of the connection pad 162 may be formed on the active surface of the semiconductor chip 160. In this case, the determination of the positional relationship with other components of the active surface is based on the passivation film 163. If necessary, the connection pads 162 may be disposed on both surfaces of the semiconductor chip 160 which may be configured as active surfaces.

The second encapsulant 170 protects the core structure 150 and the semiconductor chip 160 and provides an insulating region. The sealing form thereof is not particularly limited, and may cover at least a portion of the core structure 150 and the semiconductor chip 160, and may also fill at least a portion of the penetration portion 150H. The detailed material of the second encapsulant 170 is not particularly limited. For example, ABF or PIE may be used, but the material of the second encapsulant 170 is not limited thereto.

The connection structure 180 may redistribute the connection pads 162 of the semiconductor chip 160. In addition, the connection pad 162 of the semiconductor chip 160 may be electrically connected to the plurality of electronic components 120. The connection pads 162 of tens to millions of semiconductor chips 160 having various functions may be redistributed through the connection structure 180, respectively. The connection structure 180 includes an insulating layer 181 disposed on the core structure 150 and the active surface of the semiconductor chip 160, the redistribution layer 182 disposed on the insulating layer 181, and the connection via 183 penetrating through the insulating layer 181 and connected to the redistribution layer 182. The connection structure 180 may be designed with a relatively greater number or fewer number of layers than those illustrated in the drawings.

As the material of the insulating layer 181, an insulating material may be used. In addition to the above-described insulating material, a photoimageable dielectric material such as a PID resin may be used as the insulating material. For example, the insulating layer 181 may be a photoimageable dielectric layer. For example, when the insulating layer 181 has photoimageable properties, the insulating layer 181 may be formed to have a relatively reduced thickness, and a fine pitch of the connection via 183 may be more easily implemented. The insulating layer 181 may be a photoimageable dielectric layer containing an insulating resin and an inorganic filler. For example, when the insulating layer 181 is composed of multiple layers, these materials may be the same material, and may be different from each other as needed. In the case in which the insulating layer 181 is provided as multiple layers, the layers may be integrated according to the process, and the boundaries therebetween may be unclear.

The redistribution layer 182 may substantially redistribute the connection pads 162 of the semiconductor chip 160 and the electrodes of the plurality of electronic components 120. As a material of the redistribution layer 182, a metal material such as copper (Cu), aluminum (Al), silver (Ag), tin (Sn), gold (Au), nickel (Ni), lead (Pb), titanium (Ti), or alloys thereof may be used. The redistribution layer 182 may perform various functions according to the design of the layer. For example, the redistribution layer 182 may include a ground (GrouND: GND) pattern, a power (PoWeR: PWR) pattern, a signal (Signal: S) pattern and the like. In this case, the signal S pattern includes various signals except for a ground (GND) pattern, a power (PWR) pattern, and the like, for example, may include a data signal. The ground (GND) pattern and the power (PWR) pattern may be formed as the same pattern. In addition, the redistribution layer 182 may include various via pads, connection terminal pads, and the like.

The connection via 183 electrically connects the redistribution layer 182, the connection pad 162 and the one wiring layer 142, formed in different layers, to each other and as a result, forms an electrical path in the package module 100A. The connection via 183 may be formed of a material such as copper (Cu), aluminum (Al), silver (Ag), tin (Sn), gold (Au), nickel (Ni), lead (Pb), titanium (Ti), or alloys thereof. The connection via 183 may be a filled type via entirely filled with a metal material or may be a conformal type via formed as a metal material is formed along the wall of a via hole.

Further, the connection via 183 may have a tapered shape formed in the same direction as that of the wiring via 143. The connection via 183 may include vias for signals, vias for ground, and/or power and the like.

The passivation layer 191 is an additional structure for protecting the redistribution layer 182 of the connection structure 180 from external physical chemical damage or the like. The passivation layer 191 includes an insulating resin and an inorganic filler, but may not include glass fiber. For example, the passivation layer 191 may be ABF, but is not limited thereto, and may be a PID, a solder resist (SR), or the like. The passivation layer 191 may have a plurality of openings exposing at least a portion of the redistribution layer 182 of the connection structure 180, respectively. Nickel (Ni)/gold (Au) plating or the like may be applied to an exposed surface of redistribution layer 182.

An underbump metal 193 is an additional configuration for improving the reliability of an electrical connection metal 194. The underbump metal 193 may be formed on the opening of the passivation layer 191 and connected to the exposed surface of the redistribution layer 182. The underbump metal 193 includes a metal material such as copper (Cu), aluminum (Al), silver (Ag), tin (Sn), gold (Au), nickel (Ni), lead (Pb), titanium (Ti), or alloys thereof, or the like.

The electrical connection metal 194 is an additional configuration for physically and/or electrically connecting the package module 100A externally. The electrical connection metal 194 may be disposed on the passivation layer 191 and connected to the underbump metal 193. The package module 100A may be connected to another package or a printed circuit board through the electrical connection metal 194. The printed circuit board may be a main board of an electronic device. The electrical connection metal 194 may be formed of a low melting point metal, for example, a material including, tin (Sn) or an alloy containing tin (Sn), in more detail, solder or the like, and the material is not limited thereto. The electrical connection metal 194 may be a land, a ball, a pin, or the like. The electrical connection metal 194 may be formed of multiple layers or a single layer. In the case of multiple layers, the electrical connection metal 194 may include a copper pillar and a solder. In the case of a single layer, the electrical connection metal 194 may include solder or copper. However, an example thereof is not limited thereto. The number, spacing, arrangement type, and the like of the electrical connection metal 194 are not particularly limited and may be sufficiently modified according to design specifications by those skilled in the art.

At least one of the electrical connection metals 194 is disposed in a fan-out region. The fan-out region means an area outside the area in which the semiconductor chip 160. The fan-out package is more reliable than the fan-in package, allows multiple I/O terminals, and facilitates 3D interconnection. Compared with a Ball Grid Array (BGA) package and a Land Grid Array (LGA) package, a fan-out package may allow package thickness to be relatively thinner and excellent price competitiveness. For example, the package module 100A may be the fan-out package module 100A.

The metal film 195 is an additional structure for the electromagnetic wave shielding and heat radiation effect of the package module 100A. The metal film 195 may cover an upper surface of the second encapsulant 170, an outer side surface of the second encapsulant 170, an outer side surface of the first encapsulant 130, and an outer side surface of each of the one or more frames 110, and an outer side surface of the connection structure 180. The metal film 195 may be formed by sputter plating, and may include a metal such as copper (Cu), aluminum (Al), silver (Ag), tin (Sn), gold (Au), nickel (Ni), lead (Pb), titanium (Ti), or alloys thereof.

On the other hand, in the respective cross-sectional views, the positions of the electrodes of the electronic component 120 are not particularly considered for the sake of convenience, and the same is applied hereinafter.

Figure 13:
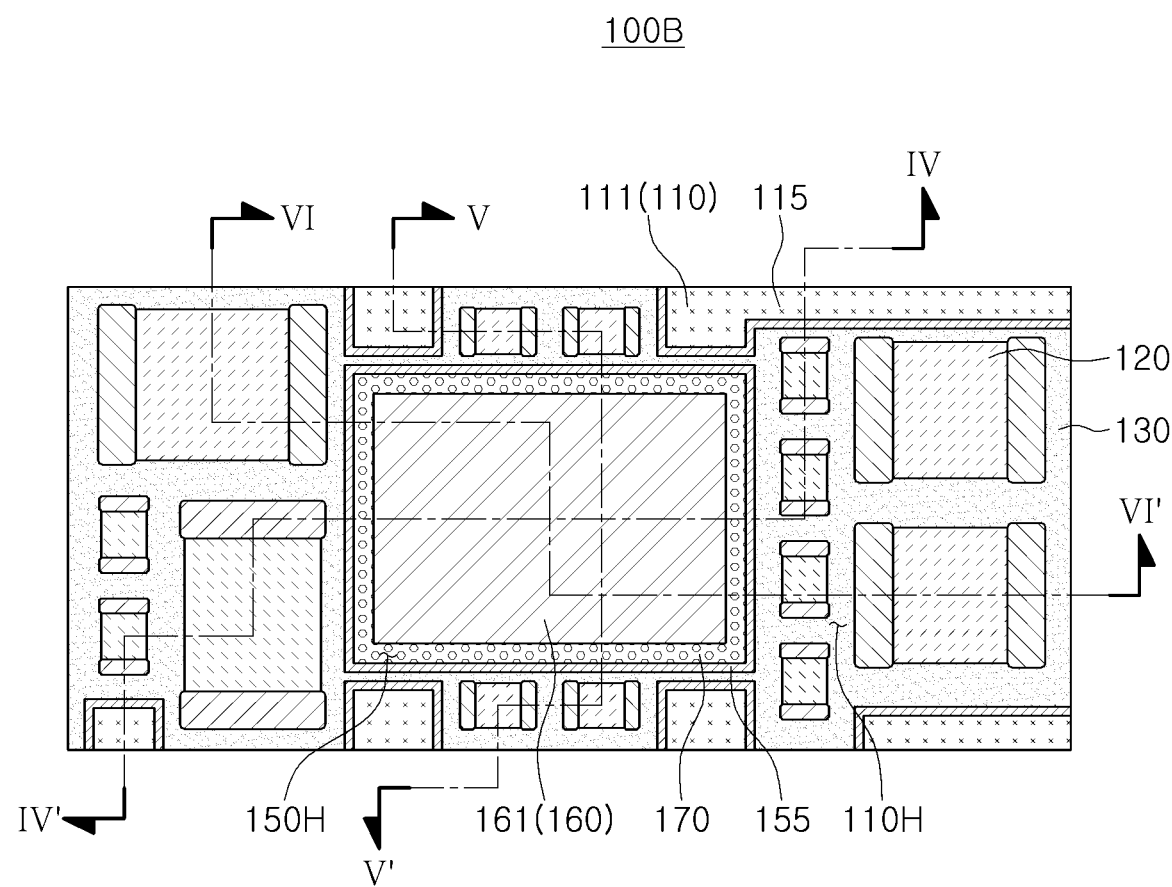
FIG. 13 is a plan view schematically illustrating another example of the package module.

FIG. 13 is a plan view schematically illustrating another example of the package module.

Figure 14:
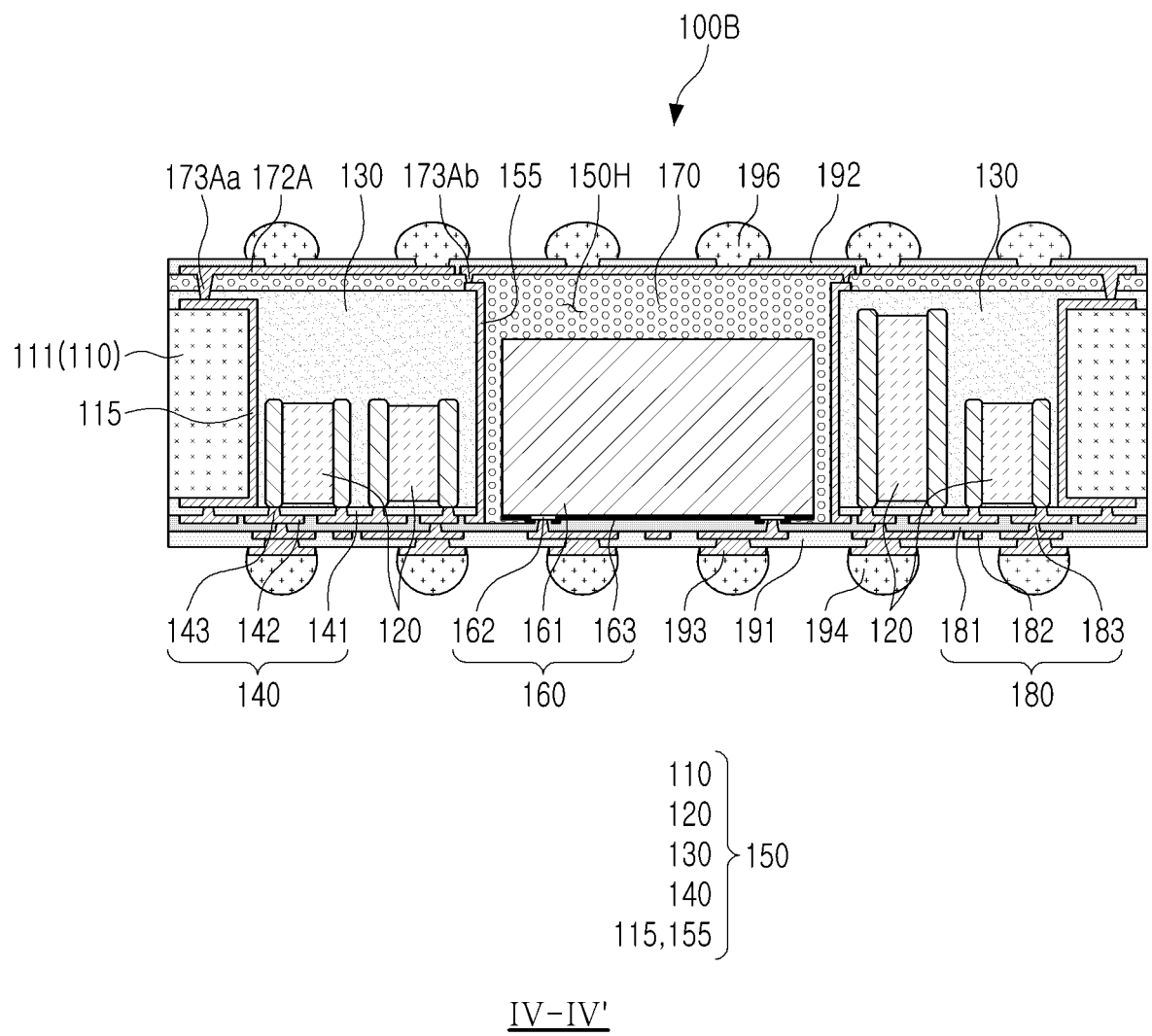
FIG. 14 is a schematic cross-sectional view of the package module, taken along line IV-IV' of FIG. 13.

FIG. 14 is a schematic cross-sectional view illustrating another example of the package module, taken along line IV-IV' of FIG. 13.

Figure 15:
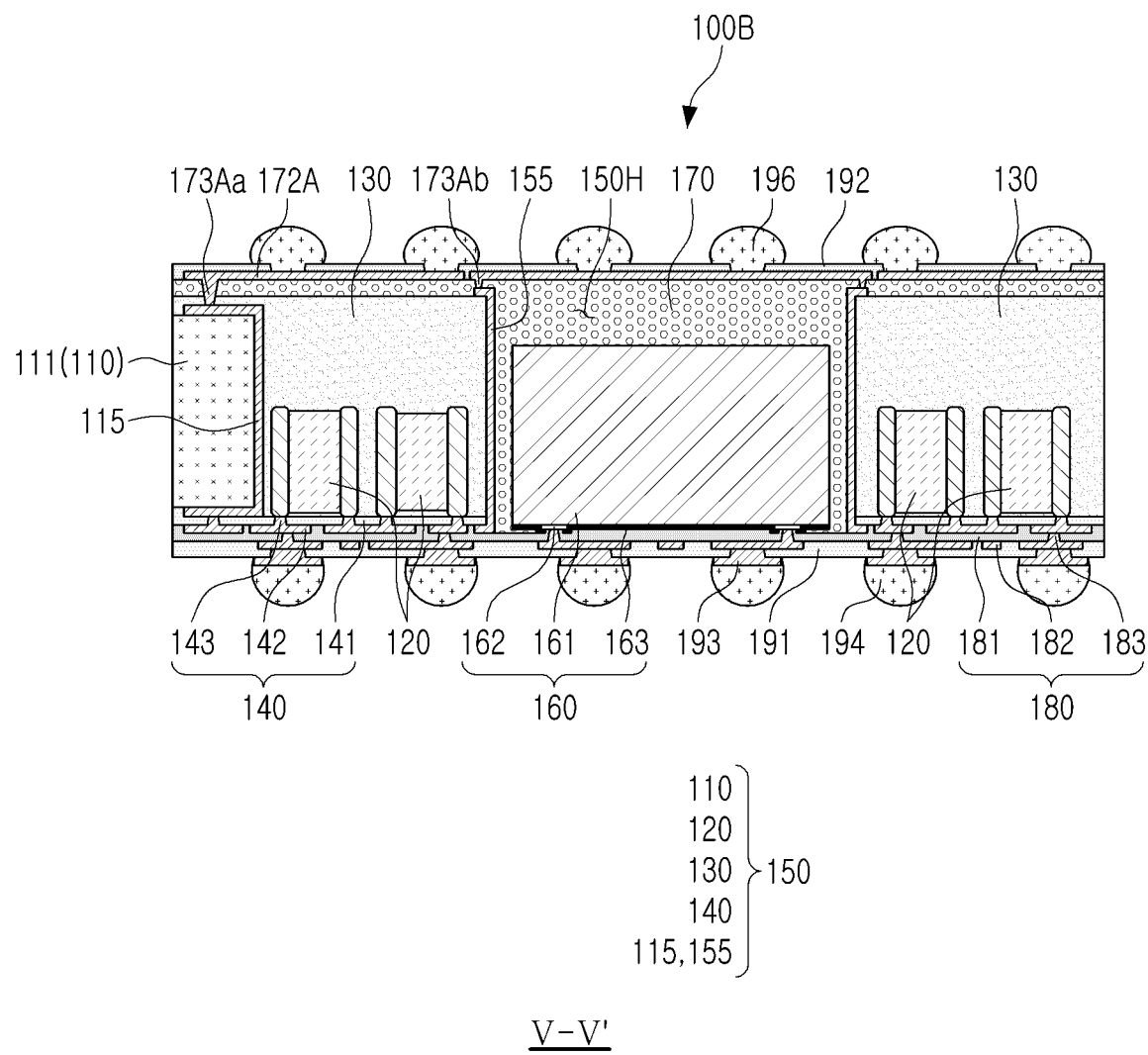
FIG. 15 is a schematic cross-sectional view of the package module, taken along line V-V' of FIG. 13.

FIG. 15 is a schematic cross-sectional view of the package module, taken along line V-V' of FIG. 13.

Figure 16:
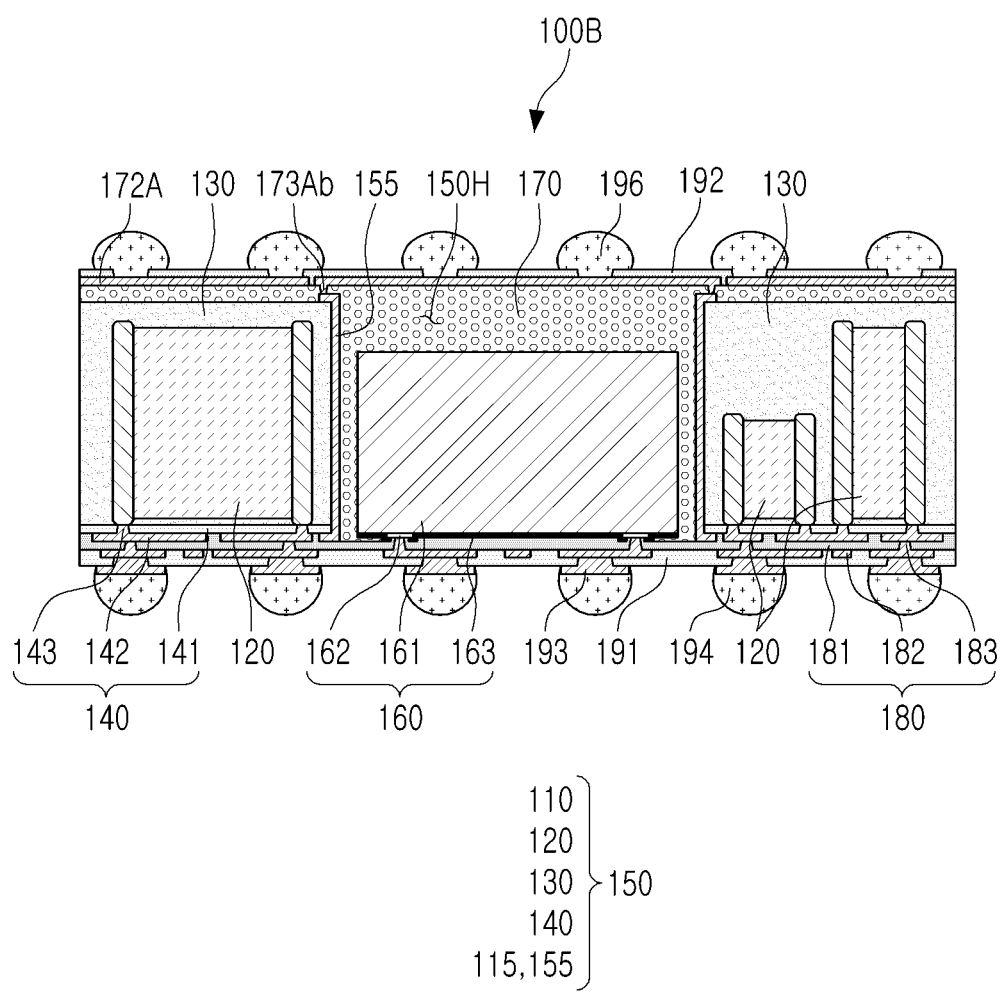
FIG. 16 is a schematic cross-sectional view of the package module, taken along line VI-VI' of FIG. 13.

FIG. 16 is a schematic cross-sectional view of the package module, taken along line VI-VI' of FIG. 13.

Referring to the drawings, a package module 100B according to another example further includes a backside metal layer 172A disposed on an opposite side of a side of the second encapsulant 170 in which the connecting structure 180 is disposed, as compared with the configurations included in the package module 100A according to the foregoing example. The backside metal layer 172A is connected to the first metal layer 115 through a first metal via 173Aa passing through the first and second encapsulants 130 and 170, and is connected to the second metal layer 155 through a second metal via 173Ab passing through the second encapsulant 170. Thus, electromagnetic interference between different types of blocks may be blocked more effectively, and an excellent heat radiation effect may be provided. In this case, the first metal via 173Aa may have a height greater than that of the second metal via 173Ab, which may have, for example, a relationship of multi-step vias. The term 'backside' used herein refers to the upper side of the semiconductor chip 160, for example, a direction of the inactive surface side in the drawings, based on the semiconductor chip 160, which will also be applied below. A passivation layer 192 covering the backside metal layer 172A may be disposed on the second encapsulant 170 as needed.

The backside metal layer 172A effectively blocks the electromagnetic waves to the back side of the semiconductor chip 160 and the plurality of electronic components 120, and as a result, may effectively isolate the different types of blocks. In addition, the backside metal layer 172A may also improve the heat dissipation effect of the semiconductor chip 160 and the plurality of electronic components 120 to the back side thereof. To this end, the backside metal layer 172A may be disposed in the form of a plate to cover the inactive surface of the semiconductor chip 160 on the second encapsulant 170 and the region directly above each of the plurality of electronic components 120. For example, the backside metal layer 172A may be formed to have the form of a single plate, and may be in the form of a plurality of plates, as required. As a material for forming the backside metal layer 172A, a metal material such as copper (Cu), aluminum (Al), silver (Ag), tin (Sn), gold (Au), nickel (Ni), lead (Pb), titanium (Ti), or alloys thereof may be used. The backside metal layer 172A may be electrically connected to the ground pattern of the wiring layer 142 and/or the redistribution layer 182 to be used as a ground plane.

The first and second metal vias 173Aa and 173Ab connect the backside metal layer 172A to the first metal layer 115 and the second metal layer 155, respectively, thereby further improve shielding of electromagnetic waves to the backside of the semiconductor chip 160 and the plurality of electronic components 120, and as a result, isolating the different types of blocks more effectively. The first and second metal vias 173Aa and 173Ab may also be formed using a metal material such as copper (Cu), aluminum (Al), silver (Ag), tin (Sn), gold (Au), nickel (Ni), titanium (Ti), or alloys thereof. The first and second metal vias 173Aa and 173Ab may each be a filled type via entirely filled with a metal material or a conformal type via formed as the metal material is formed only along walls of vias holes. Further, the first and second metal vias 173Aa and 173Ab may have a tapered shape in a direction opposite to that of the wiring via 143. The first and second metal vias 173Aa and 173Ab may be electrically connected to the ground pattern of the wiring layer 142 and/or the redistribution layer 182 to be used as a ground plane. The first metal via 173Aa may have a height greater than that of the second metal via 173Ab. The first and second metal vias 173Aa and 173Ab may be trench-shaped vias formed continuously to have a predetermined length in a plane. For example, the second metal via 173Ab may be formed to continuously surround the through portion 150H along a wall surface of the through portion 150H on a plan. In this case, electromagnetic wave shielding is more effectively exhibited.

The passivation layer 192 may protect the backside metal layer 172A from external physical chemical damage or the like. The passivation layer 192 may include, but is not limited to, an insulating resin and an inorganic filler, but does not include glass fibers, for example, may be formed of ABF. The passivation layer 192 may have a plurality of openings that respectively expose at least a portion of each of the backside metal layers 172A, and the exposed surface of the backside metal layer 172A may be plated with nickel (Ni)/gold (Au).

Other contents are substantially the same as those described above with reference to FIGS. 9 to 12, 29 and 30, and a detailed description thereof will be omitted.

Figure 17:
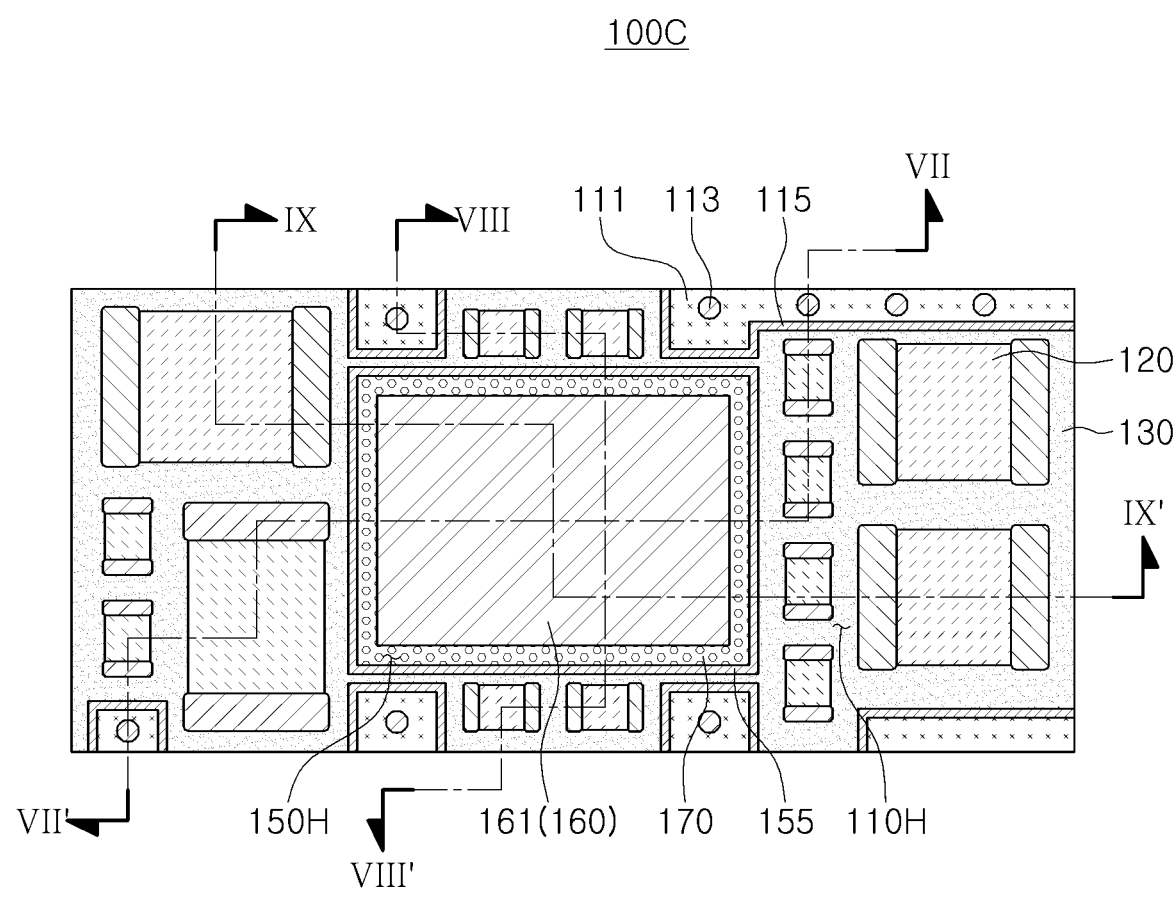
FIG. 17 is a plan view schematically illustrating another example of the package module.

FIG. 17 is a plan view schematically illustrating another example of the package module.

Figure 18:
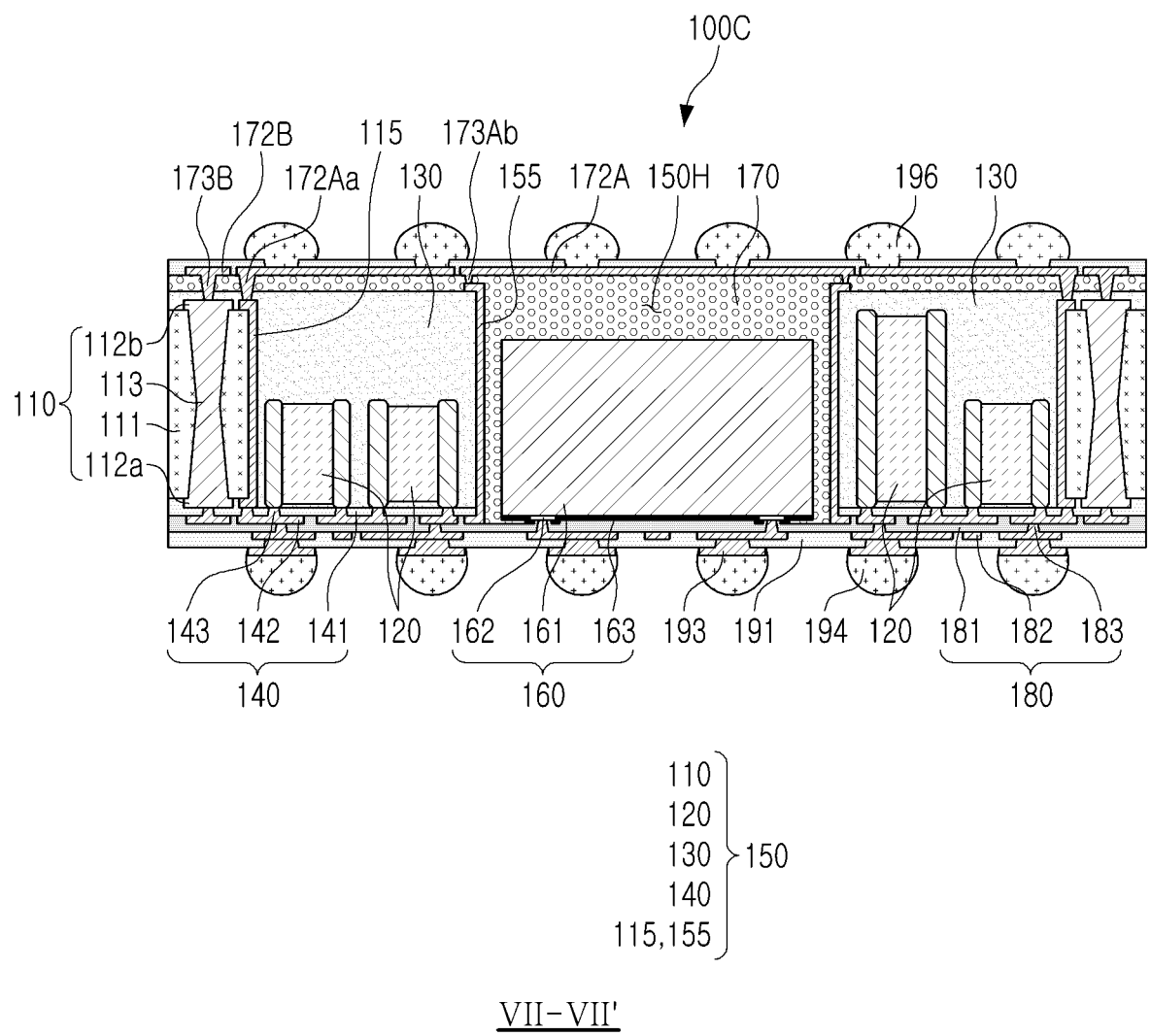
FIG. 18 is a schematic cross-sectional view of the package module, taken along line VII-VII' of FIG. 17.

FIG. 18 is a schematic cross-sectional view of the package module, taken along line VII-VII' of FIG. 17.

Figure 19:
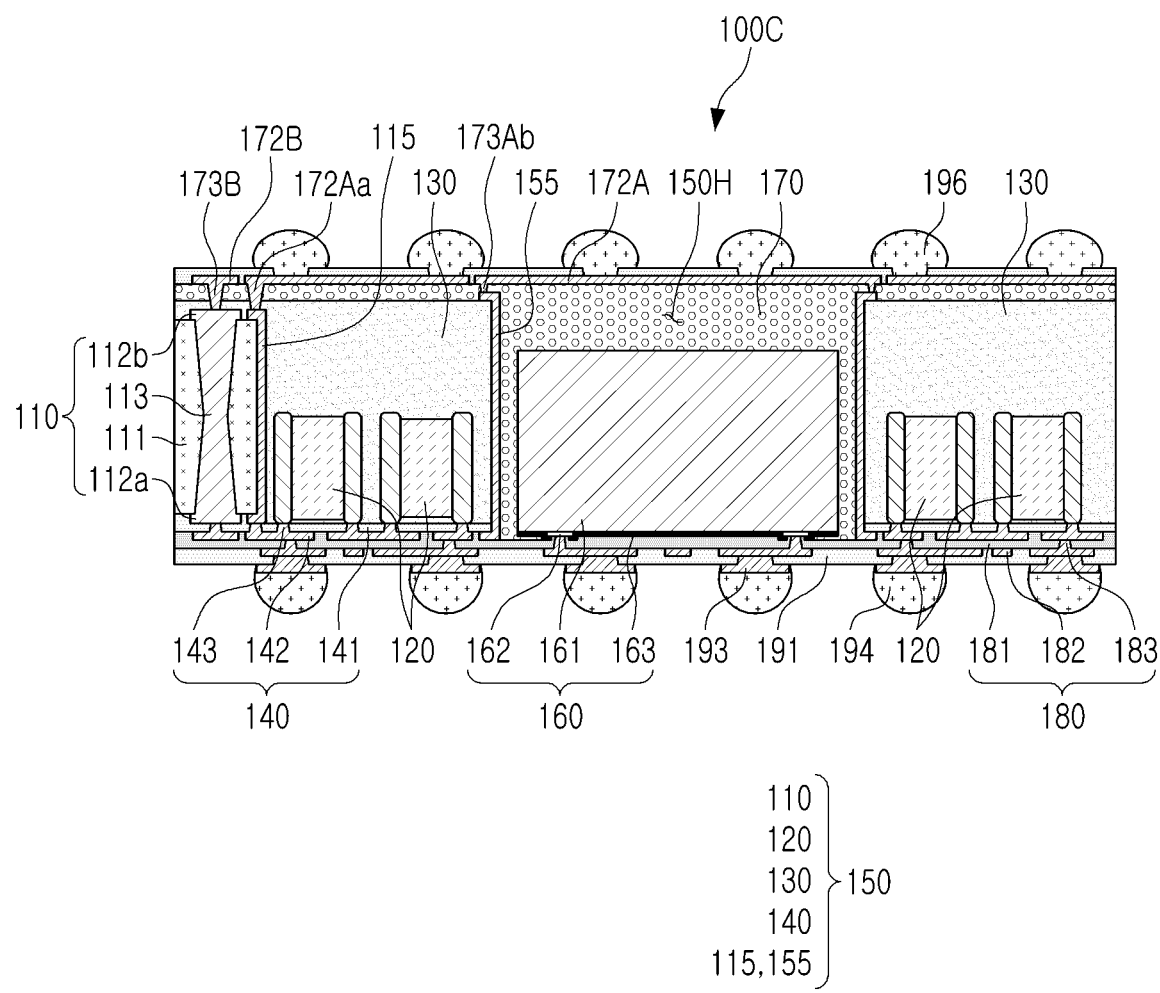
FIG. 19 is a schematic cross-sectional view of the package module, taken along line VIII-VIII' of FIG. 17.

FIG. 19 is a schematic cross-sectional view of the package module, taken along line VIII-VIII' of FIG. 17.

Figure 20:
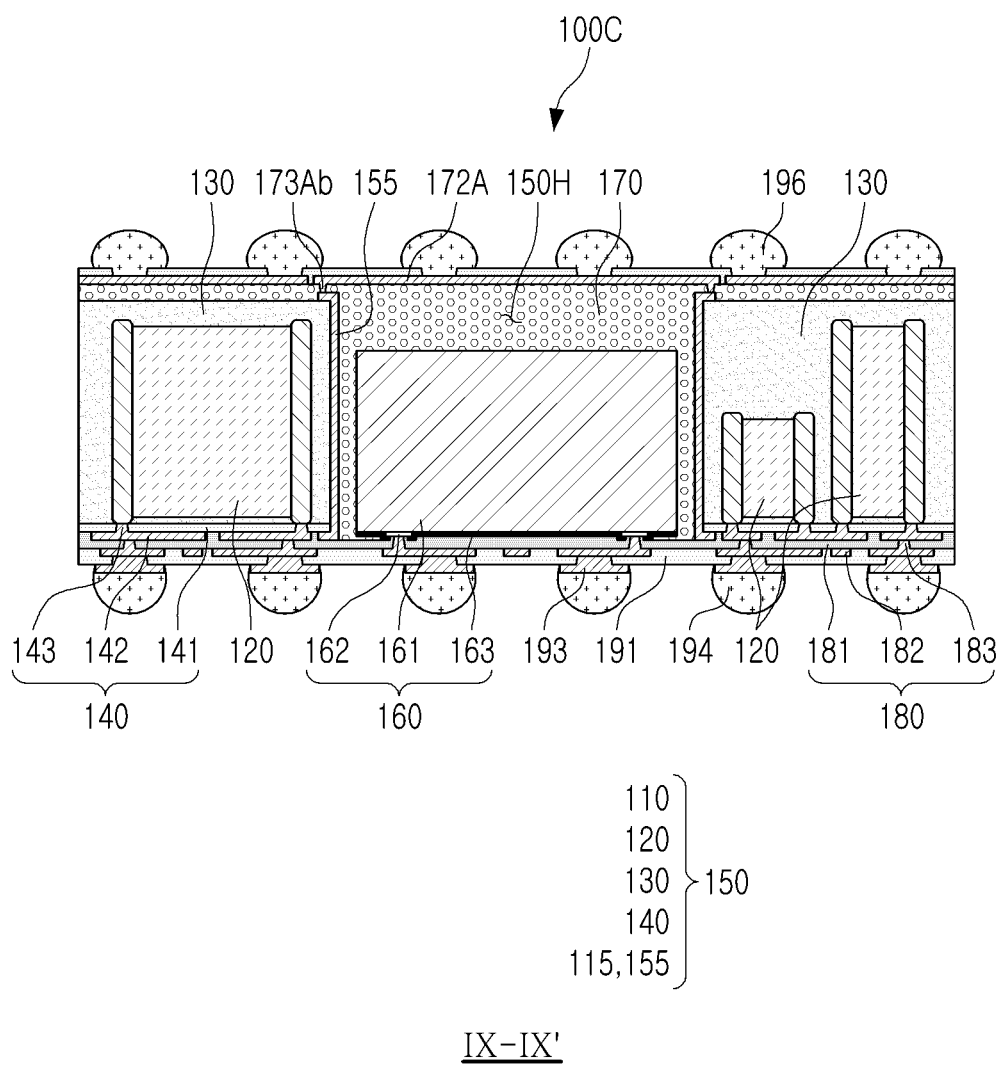
FIG. 20 is a schematic cross-sectional view of the package module, taken along line IX-IX' of FIG. 17.

FIG. 20 is a schematic cross-sectional view of the package module, taken along line IX-IX' of FIG. 17.

Referring to the drawings, in the case of a package module 100C according to another example, at least one of the one or more frames 110 provided in the package module 100B according to the example described above includes a plurality of conductor pattern layers 112a and 112b that are electrically connected to each other. The first and second conductor pattern layers 112a and 112b are disposed on both surfaces of the insulating layer 111, respectively, to be electrically connected to each other through a conductor via 113 passing through the insulating layer 111. In this case, the number of layers of the redistribution layer 182 of the connection structure 180 may be reduced. In addition, one or more frames 110 includes the conductor via 113 electrically connecting the conductor pattern layers 112a and 112b to each other, and may also function as an electrical connection member for vertical electrical connection. A backside conductor pattern layer 172B is further disposed on an opposite side of a side of the second encapsulant 170 in which the connecting structure 180 is disposed, and the backside conductor pattern layer 172B is electrically connected to the plurality of conductor pattern layers 112a and 112b through the backside conductor via 173B passing through the first and second encapsulants 130 and 170. With the introduction of the backside conductor pattern layer 172B, the application of the package module 100A to a POP structure may be facilitated. A passivation layer 192 covering the backside metal layer 172A and the backside conductor pattern layer 172B may be disposed on the second encapsulant 170. On the passivation layer 192, an electrical connection metal 196 may be respectively disposed on the openings exposing the backside metal layer 172A and the backside conductor pattern layer 172B, to be connected to the backside metal layer 172A and the backside conductor pattern layer 172B.

The first and second conductor pattern layers 112a and 112b may serve to redistribute connection pads 162 of the semiconductor chip 160 and electrodes of the plurality of electronic components 120. In addition, the first and second conductor pattern layers 112a and 112b may provide a vertical electrical connection path of the package module 100C. The first and second conductor pattern layers 112a and 112b may be formed using a metal material such as copper (Cu), aluminum (Al), silver (Ag), tin (Sn), gold (Au), nickel (Ni) lead (Pb), titanium (Ti), or alloys thereof. The first and second conductor pattern layers 112a and 112b may perform various functions according to the design of the layer. For example, the first and second conductor pattern layers 112a and 112b may include a ground (GND) pattern, a power (PWR) pattern, a signal (S) pattern, and the like. In this case, the signal S pattern includes various signals, except for a ground (GND) pattern, a power (PWR) pattern, and the like, for example, may include a data signal and the like. The ground (GND) pattern and the power (PWR) pattern may be formed in the same pattern. In addition, the first and second conductor pattern layers 112a and 112B may respectively include various via pads and the like. The first and second conductor pattern layers 112a and 112b of the frame 110 may have a relatively great thickness as that of the redistribution layer 182 of the connection structure 180.

The conductor vias 113 electrically connect the first and second conductor pattern layers 112a and 112b formed on different layers, thereby forming an electrical path in the frame 110. The conductor vias 113 may also be formed using a metal material such as copper (Cu), aluminum (Al), silver (Ag), tin (Sn), gold (Au), nickel (Ni), lead (Pb), titanium (Ti) or alloys thereof. The conductor vias 113 may be filled type vias entirely filled with a metal material, or may be conformal type vias in which a metal material is formed along an inner side surface of a via hole. The conductor vias 113 may have an hourglass shape, a cylindrical shape, or the like. The conductor vias 113 may include vias for signals, vias for ground and/or power, and the like.

The backside conductor pattern layer 172B may be electrically connected to the first and second conductor pattern layers 112a and 112b of the frame 110, and may also provide pads for electrical connection in electrical connection metals, and thus, may provide a connection path of signals when the package module 100A is mounted on a main board or the like. The backside conductor pattern layer 172B may also redistribute the connection pads 162 of the semiconductor chip 160 and electrodes of the plurality of electronic components 120. As the material for forming the backside conductor pattern layer 172B, a metal material such as copper (Cu), aluminum (Al), silver (Ag), tin (Sn), gold (Au), nickel (Ni), lead (Pb), or alloys thereof may be used. The backside conductor pattern layer 172B may perform various functions according to the design. For example, the backside conductor pattern layer 172B may include a signal pattern and the like, and further, may include via pads, electrical connection metal pads, and the like.

The backside conductor via 173B electrically connects the backside conductor pattern layer 172B and the second conductor pattern layer 112b formed in different layers. The backside conductor via 173B may also be formed using a metal material such as copper (Cu), aluminum (Al), silver (Ag), tin (Sn), gold (Au), nickel (Ni), lead (Pb), titanium (Ti), or alloys thereof. The backside conductor via 173B may also be filled type via entirely filled with a metal material, or may be a conformal type via formed as the metal material is formed only along a wall of a via hole. Further, the backside conductor via 173B may have a tapered shape formed in a direction opposite to that of the wiring via 143, and may also be used as a via for signal connection.

The electrical connection metal 196 may physically and/or electrically connect the package module 100C externally. For example, the package module 100C may be connected to another package or a printed circuit board through the electrical connection metal 196. The electrical connection metal 196 may be formed of a low melting point metal, for example, a material including tin (Sn) or an alloy including tin (Sn), in more detail, solder or the like by way of example, but the material thereof is not particularly limited. The electrical connection metal 196 may be a land, a ball, a pin, or the like. The electrical connection metal 196 may be formed as a multilayer or a single layer. In the case of a multi-layered structure, the electrical connection metal 196 may include a copper pillar and a solder. In the case of a single layer, the electrical connection metal 196 may include solder or copper, but an example thereof is not limited thereto. The number, spacing, arrangement type, and the like of the electrical connection metal 196 are not particularly limited, and may be sufficiently modified according to design specifications for those skilled in the art.

The other contents are substantially the same as those described above with reference to FIGS. 9 to 16, 29 and 30, and a detailed description thereof will be omitted.

Figure 21:
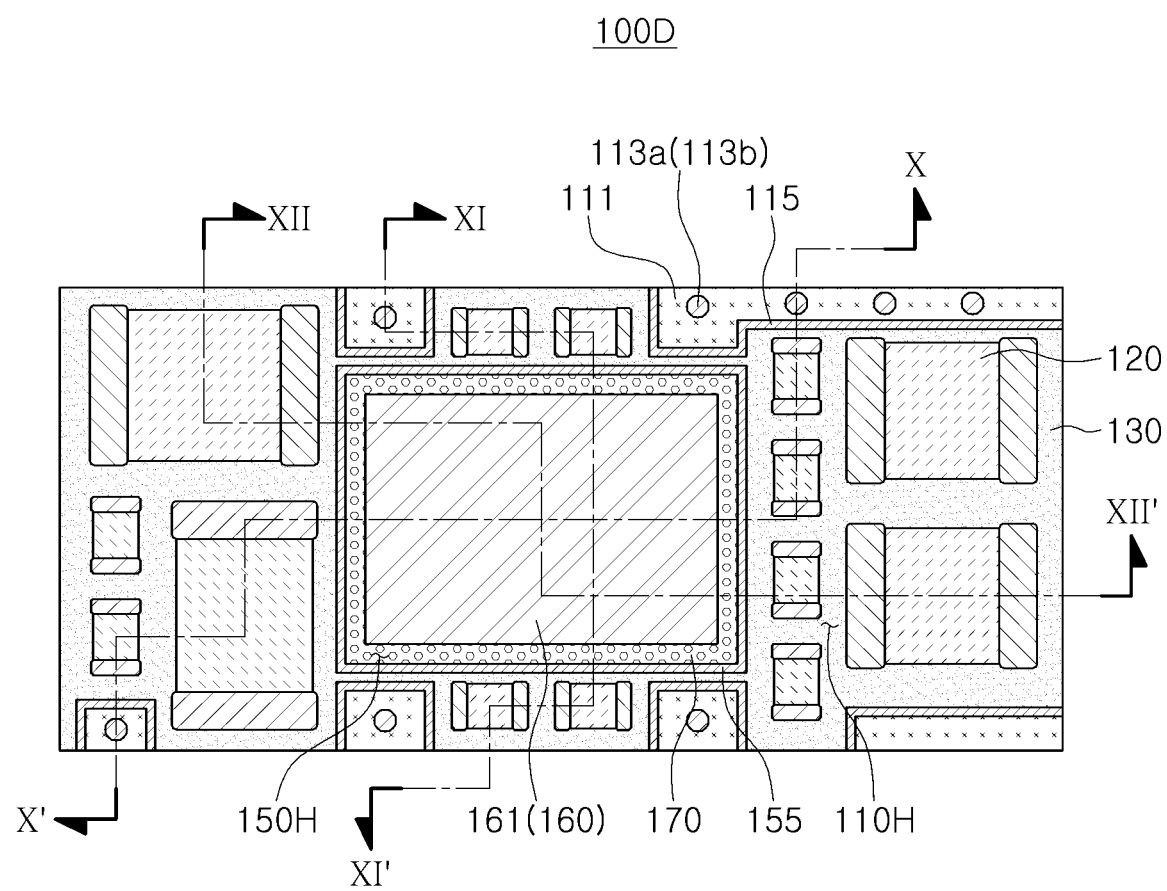
FIG. 21 is a plan view schematically illustrating another example of the package module.

FIG. 21 is a plan view schematically illustrating another example of the package module.

Figure 22:
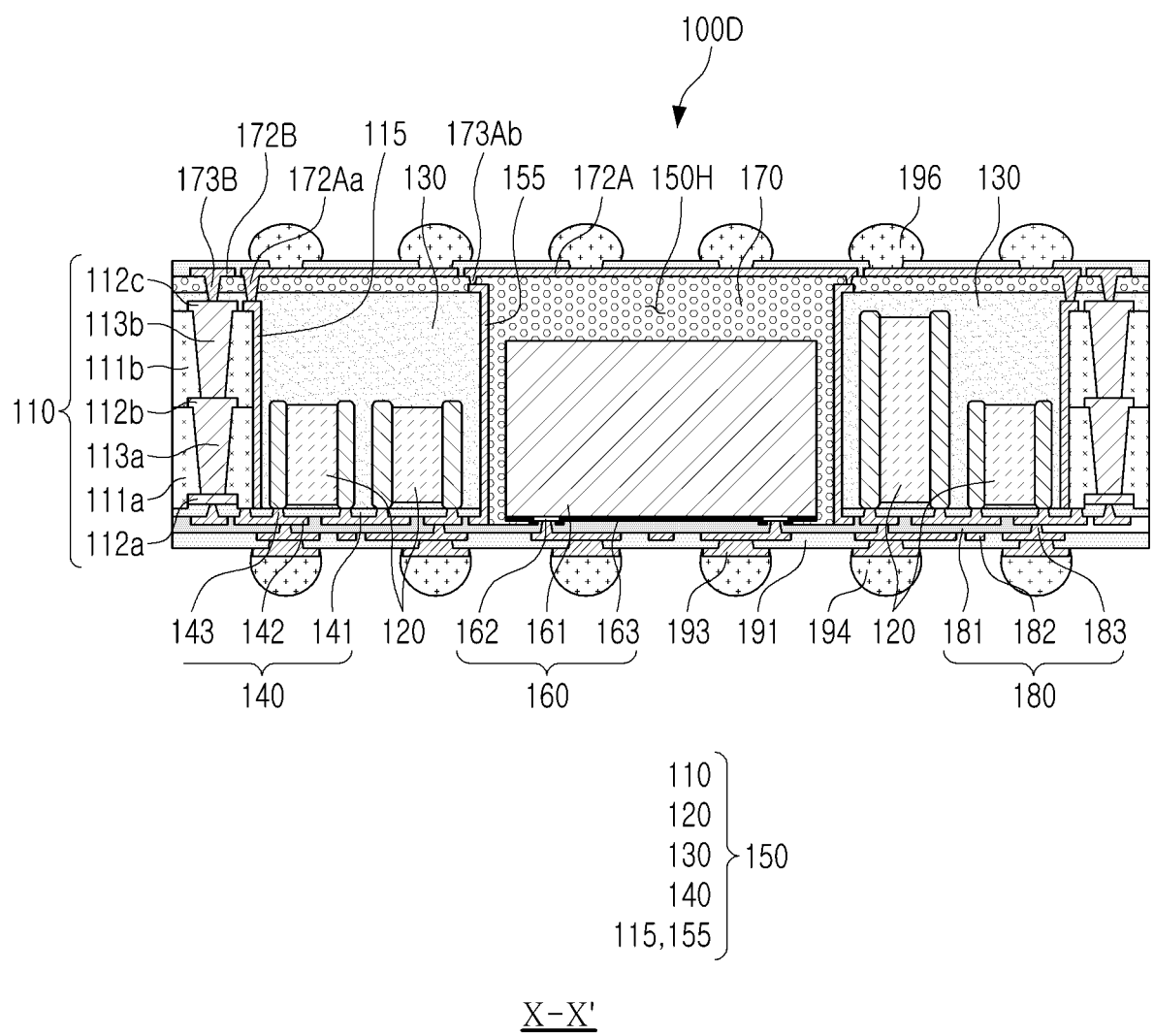
FIG. 22 is a schematic cross-sectional view of the package module, taken along line X-X' of FIG. 21.

FIG. 22 is a schematic cross-sectional view of the package module, taken along line X-X' of FIG. 21.

Figure 23:
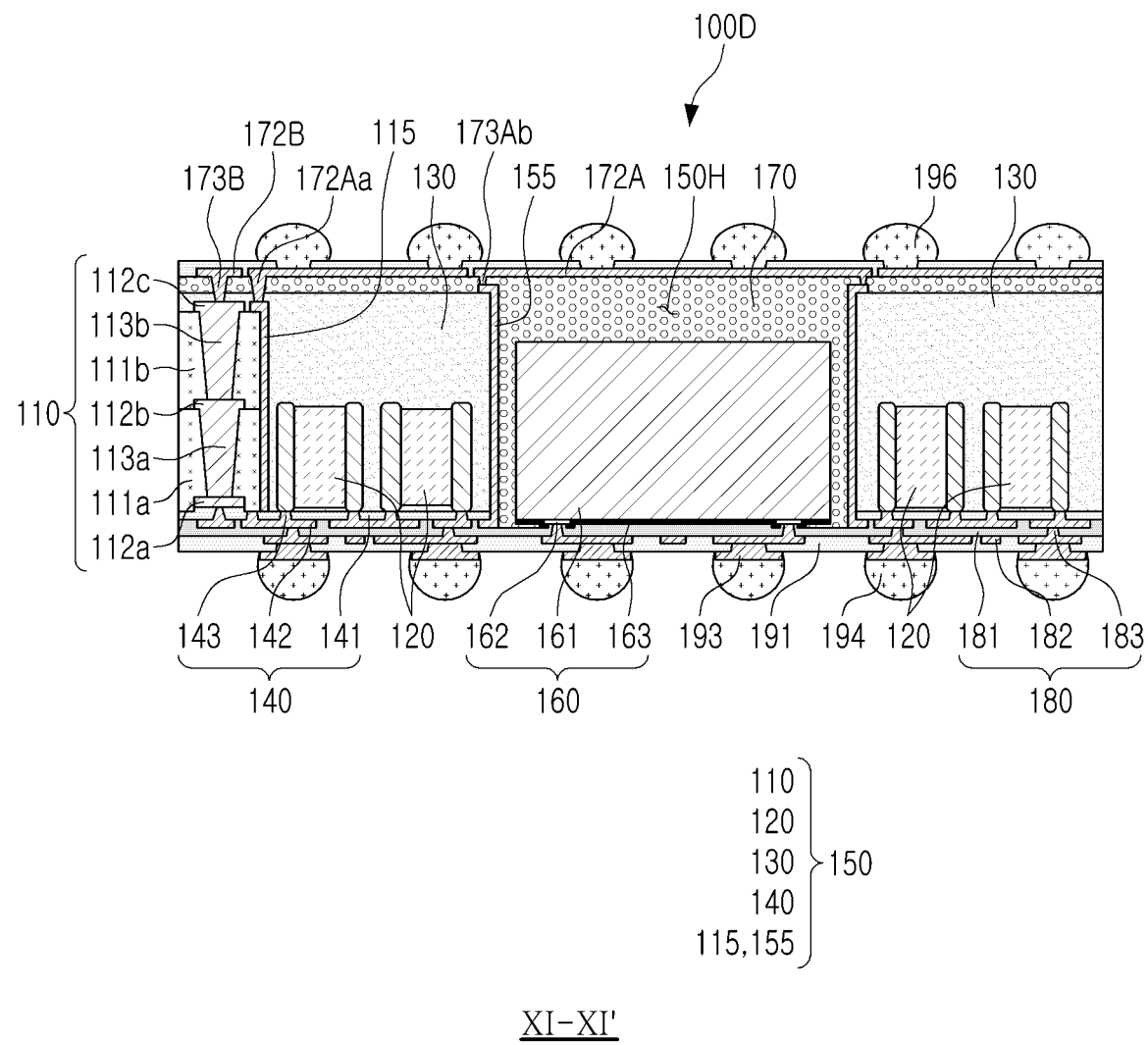
FIG. 23 is a schematic cross-sectional view of the package module, taken along line XI-XI' of FIG. 21.

FIG. 23 is a schematic cross-sectional view of the package module, taken along line XI-XI' of FIG. 21.

Figure 24:
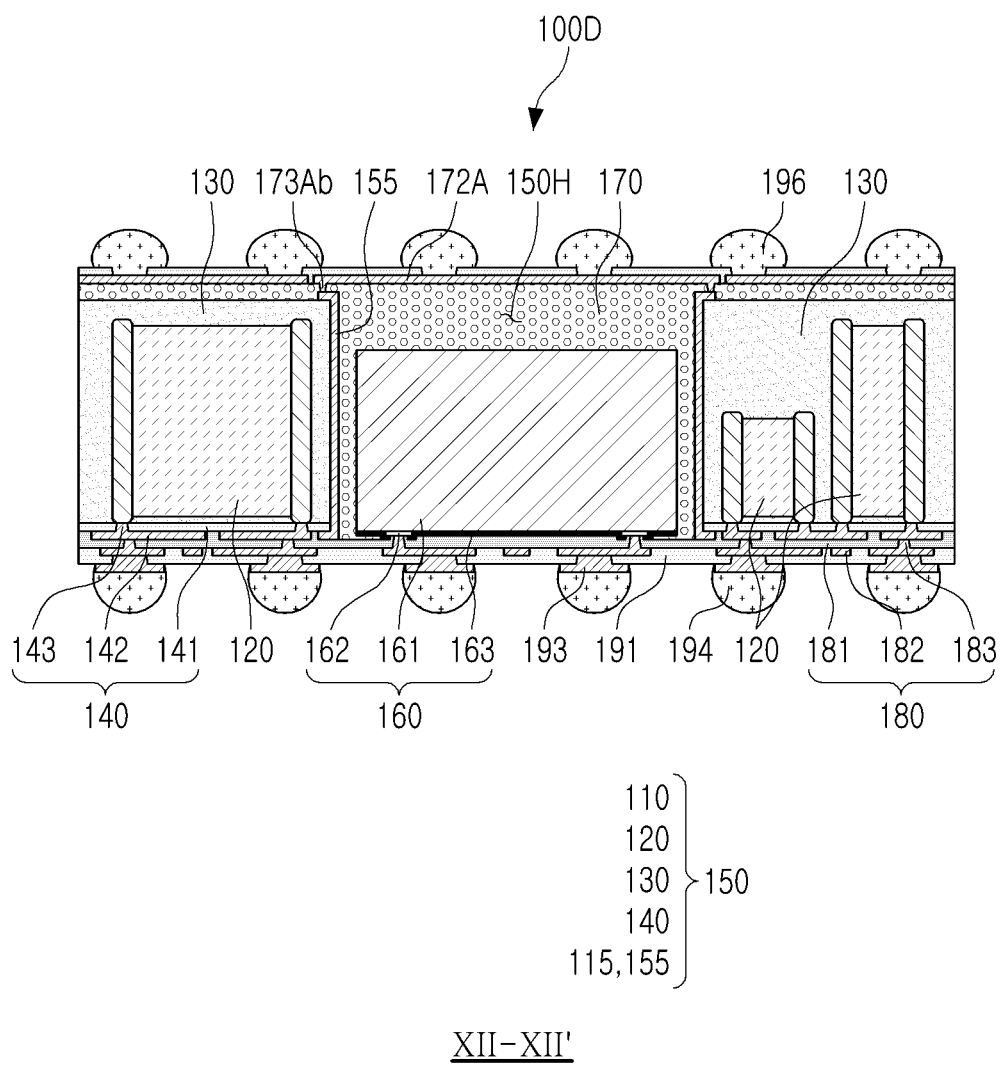
FIG. 24 is a schematic cross-sectional view of the package module, taken along line XII-XII' of FIG. 21.

FIG. 24 is a schematic cross-sectional view of the package module, taken along line XII-XII' of FIG. 21.

Referring to the drawings, in a package module 100D according to another example, at least one of the one or more frames 110 provided in the package module 100C according to the example described above includes a first insulating layer 111a, a first conductor pattern layer 112a embedded in the first insulating layer 111a in such a manner that one surface thereof is exposed thereto, a second conductor pattern layer 112b disposed on an opposite side of the side of the first insulating layer 111a in which the first conductor pattern layer 112a is embedded, a second insulating layer 111b disposed on the opposite side of the side of the first insulating layer 111a in which the first conductor pattern layer 112a is embedded, and covering the second conductor pattern layer 112b, and a third conductor pattern layer 112c disposed on an opposite side of a side of the second insulating layer 111b in which the second conductor pattern layer 112b is embedded. The first to third conductor pattern layers 112a, 112b and 112c may be electrically connected to the connection pad 162 and the plurality of electronic components 120. The first and second conductor pattern layers 112a and 112b, and the second and third conductor pattern layers 112b and 112c, are respectively connected through the first and second conductor vias 113a and 113b passing through the first and second insulating layers 111a and 111b, respectively. As such, when the frame 110 includes a relatively greater number of conductor pattern layers 112a, 112b and 112c, the design of the connection structure 180 may be further simplified, and thus, a problem relevant to a yield of the semiconductor chip 160 occurring in the process of forming the connection structure 180 may be reduced.

The material of the first and second insulating layers 111a and 111b is not particularly limited. For example, an insulating material may be used. As the insulating material, a thermosetting resin such as an epoxy resin, a thermoplastic resin such as polyimide, or a mixture of these resins with an inorganic filler, or a resin impregnated with a core material such as glass fiber together with inorganic filler, for example, prepreg resin, ABF resin, FR-4 resin, BT or the like may be used.

The first to third conductor pattern layers 112a to 112c may serve to redistribute the connection pads 162 of the semiconductor chip 160 and the electrodes of the plurality of electronic components 120, and may allow the frame 110 to perform the function of the electrical connecting member. The first to third conductor pattern layers 112a, 112b and 112c may be formed using a metal material such as copper (Cu), aluminum (Al), silver (Ag), tin (Sn), gold (Au), nickel (Ni), lead (Pb), titanium (Ti), or alloys thereof. The first to third conductor pattern layers 112a, 112b and 112c may perform various functions according to the design of the layer. For example, the first to third conductor pattern layers 112a, 112b and 112c may include a ground (GND) pattern, a power (PWR) pattern, a signal (S) pattern, and the like. The ground (GND) pattern and the power (PWR) pattern may be configured as the same pattern. The signal S pattern includes various signals except the ground (GND) pattern, the power (PWR) pattern, and the like, for example, includes a data signal, and may also include signal via pads, ground via pads, and the like.

A step generated by the thickness of the first conductor pattern layer 112a is significantly reduced by embedding the first conductor pattern layer 112a in the first insulating layer 111a, such that an insulation distance of the connection structure 180 is constant. For example, a difference between a distance from the redistribution layer 182 of the connection structure 180 to one surface of the first insulating layer 111a, and a distance from the redistribution layer 182 of the connection structure 180 to one surface of the connection pad 162, may be less than a thickness of the first conductor pattern layer 112a. Therefore, the high-density wiring design of the connection structure 180 may be facilitated. In this case, the first conductor pattern layer 112a may be recessed into the first insulating layer 111a. When the first conductor pattern layer 112a is recessed into the first insulating layer 111a so that one surface of the first insulating layer 111a and one surface of the first conductor pattern layer 112a have a step, a material of the first encapsulant 130 may be prevented from bleeding and contaminating the first conductor pattern layer 112a. The second conductor pattern layer 112b of the frame 110 may be positioned between the active surface and the inactive surface of the semiconductor chip 160. The thickness of each of the first to third conductor pattern layers 112a, 112b and 112c may be greater than a thickness of the redistribution layer 182.

The first and second conductor vias 113a and 113b electrically connect the first to third conductor pattern layers 112a, 112b and 112c formed on different layers to form an electrical path in the frame 110. The first and second conductor vias 113a and 113b may also be formed of a metal material. The first and second conductor vias 113a and 113b may be filled type vias entirely filled with a metal material or may be conformal type vias formed as a metal material is formed along an inner side of a via hole, and may have a tapered shape in the same direction as each other. A portion of the pad of the first conductor pattern layer 112*a* may serve as a stopper when the hole for the first conductor via 113*a* is formed. Thus, the first conductor via 113*a* may have a tapered shape in which a width of a lower surface is smaller than a width of an upper surface, which may be advantages in terms of a process. In this case, the first conductor via 113*a* may be integrated with a pad pattern of the second conductor pattern layer 112*b*. In addition, when forming the hole for the second conductor via 113*b*, a portion of pads of the second conductor pattern layer 112*b* may serve as a stopper, and thus, the second conductor via 113*b* may have a tapered shape in which a width of a lower surface is smaller than a width of an upper surface, which may be advantages in terms of a process. In this case, the second conductor via 113*b* may be integrated with the pad pattern of the third conductor pattern layer 112*c*.

Other details are substantially the same as those described with reference to FIGS. 9 to 20, FIGS. 29 and 30, and a detailed description thereof will be omitted.

Figure 25:
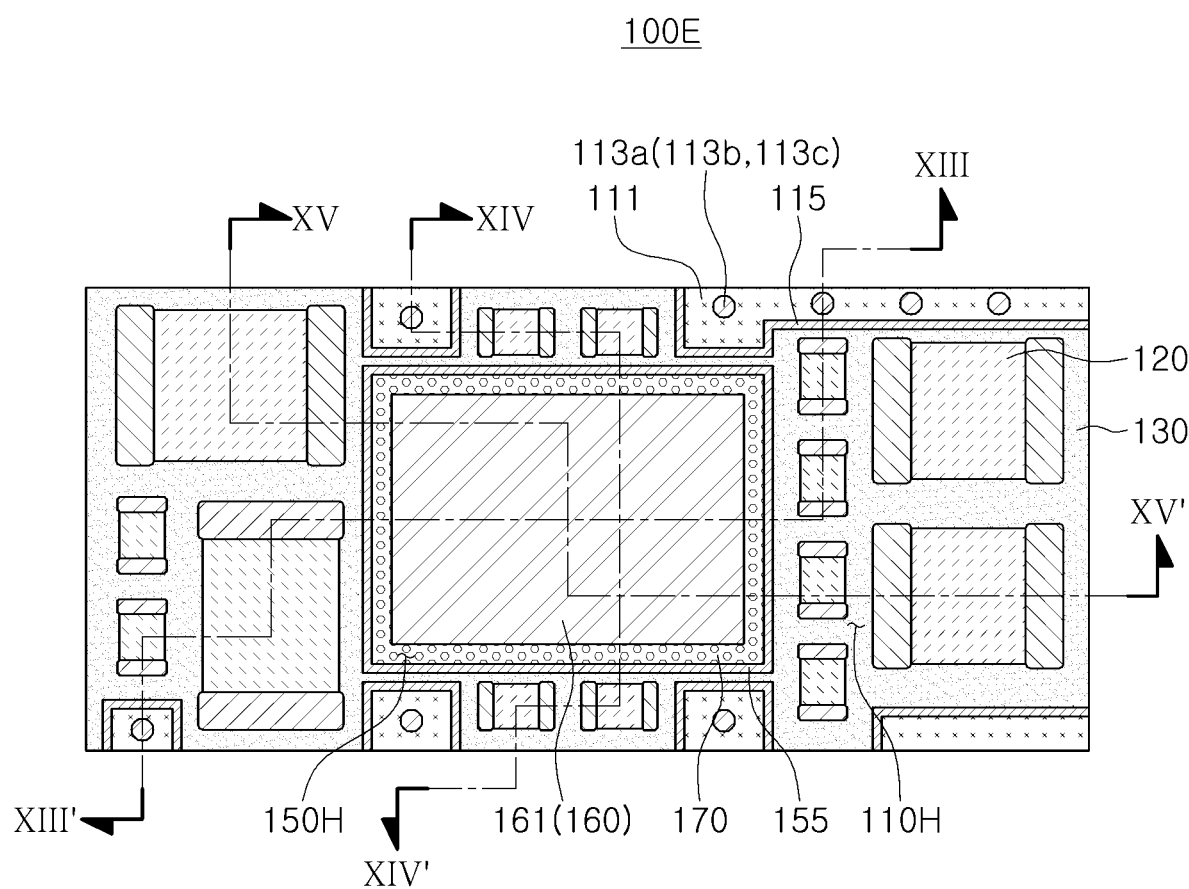
FIG. 25 is a plan view schematically illustrating another example of the package module.

FIG. 25 is a plan view schematically illustrating another example of a package module.

Figure 26:
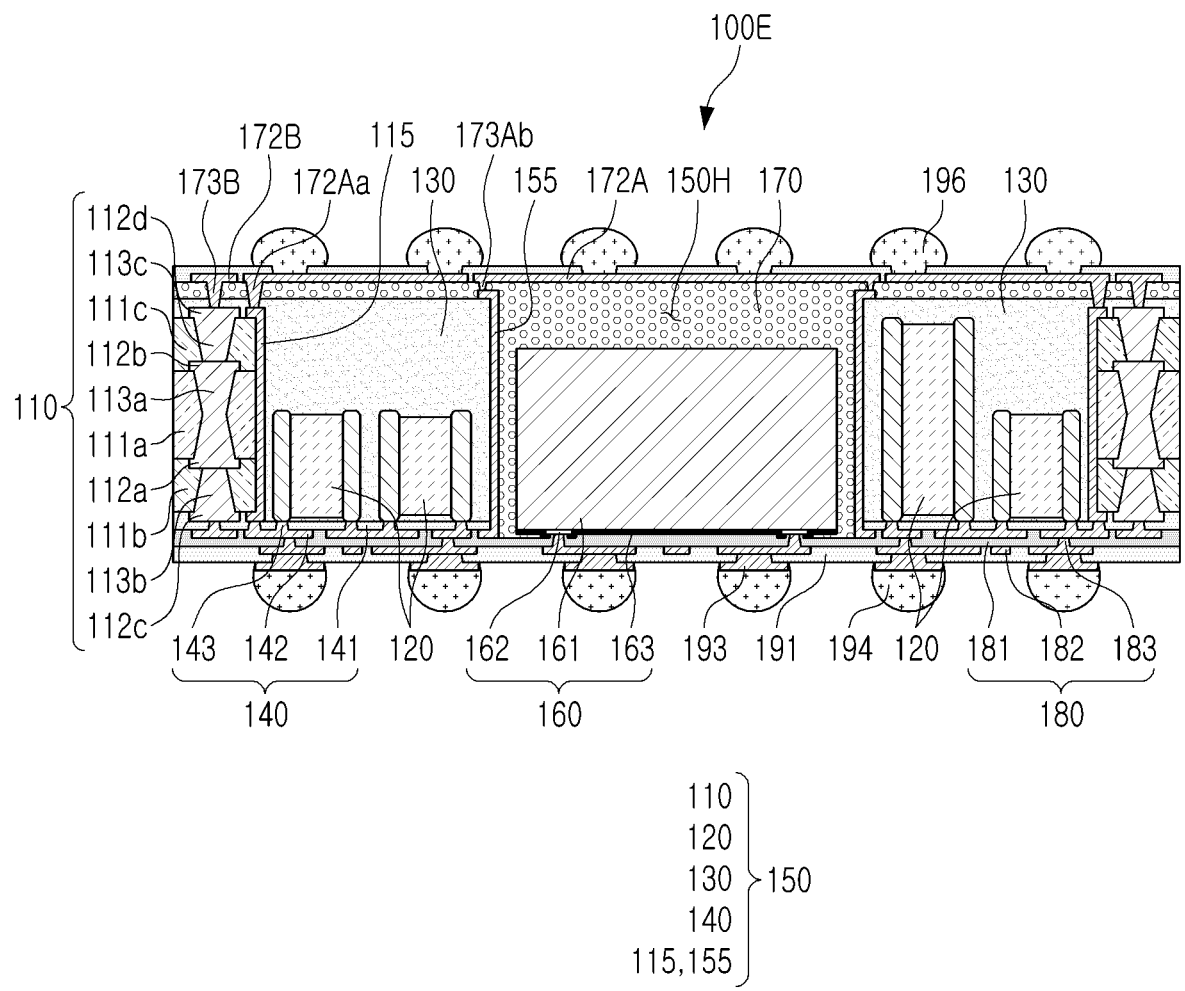
FIG. 26 is a schematic cross-sectional view of the package module, taken along line XIII-XIII' of FIG. 25.

FIG. 26 is a schematic cross-sectional view of the package module, taken along line XIII-XIII' of FIG. 25.

Figure 27:
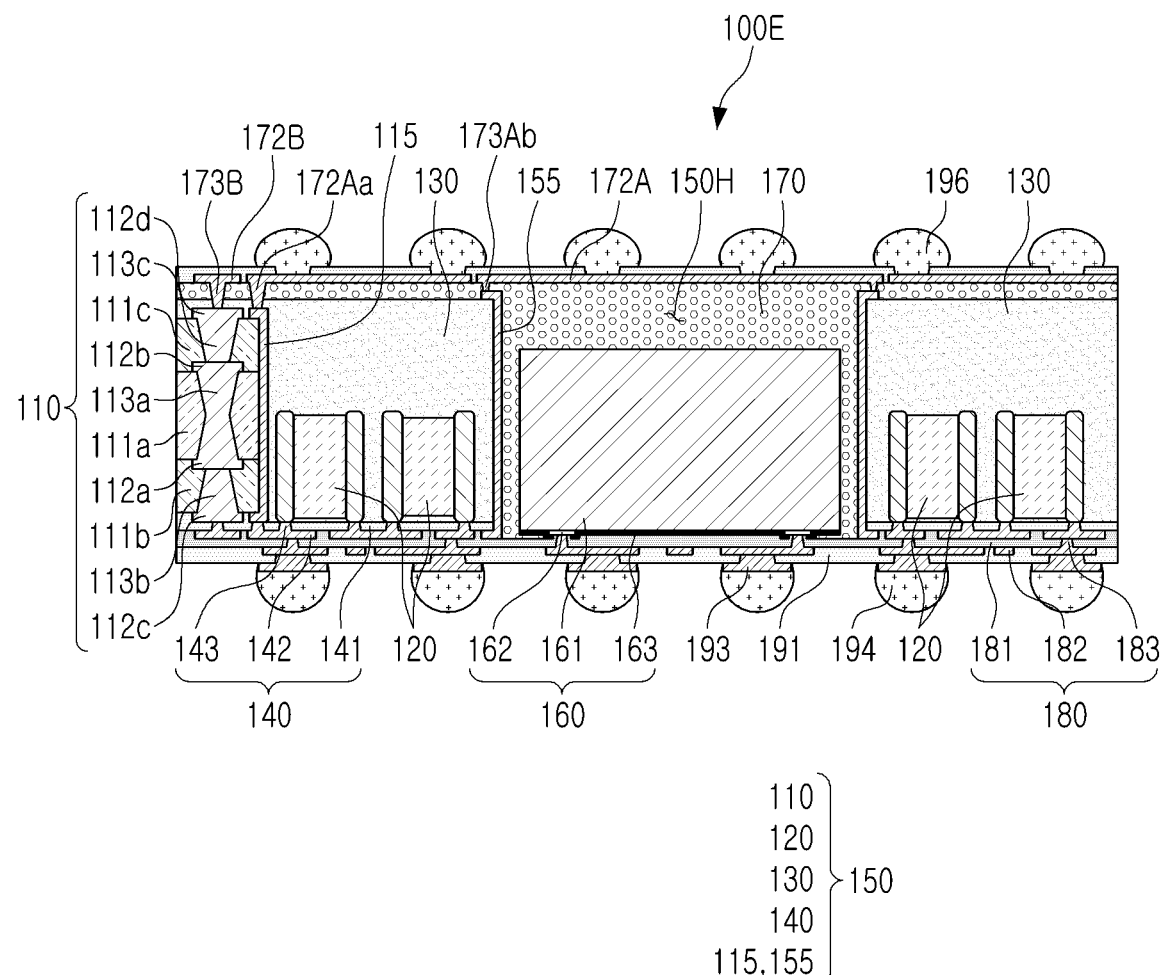
FIG. 27 is a schematic cross-sectional view of the package module, taken along line XIV-XIV' of FIG. 25.

FIG. 27 is a schematic cross-sectional view of the package module, taken along line XIV-XIV' of FIG. 25.

Figure 28:
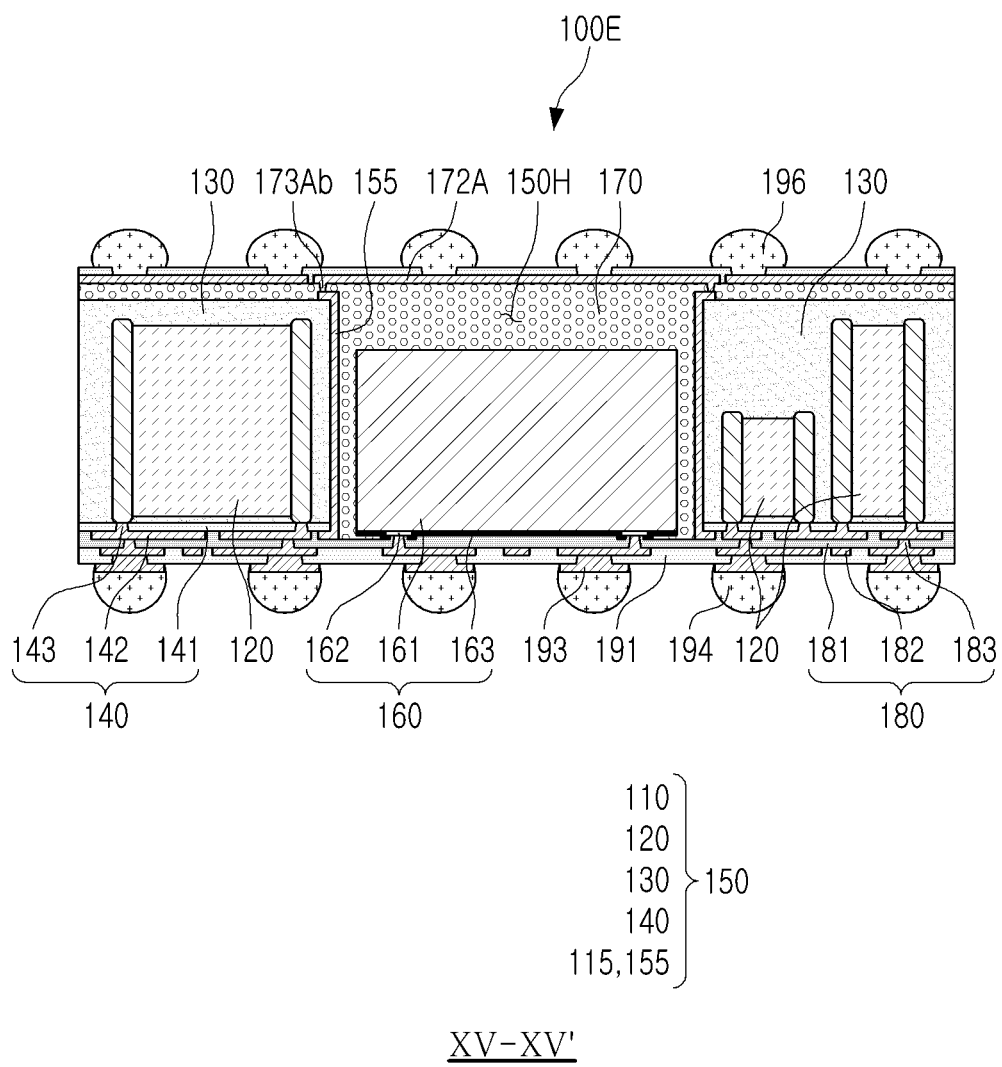
FIG. 28 is a schematic cross-sectional view of the package module, taken along line XV-XV' of FIG. 25.

FIG. 28 is a schematic cross-sectional view of the package module, taken along line XV-XV' of FIG. 25.

Referring to the drawings, in a package module 100E according to another example, at least one of the one or more frames 110 in the package module 100E according to the foregoing example includes a first insulating layer 111*a*, a first conductor pattern layer 112*a* and a second conductor pattern layer 112*b* disposed on both surfaces of the first insulating layer 111*a*, a second insulating layer 111*b* and a third insulating layer 111*c* disposed on both surfaces of the first insulating layer 111*a* to cover the first conductor pattern layer 112*a* and the second conductor pattern layer 112*b*, respectively, a third conductor pattern layer 112*c* disposed on an opposite side of a side of the second insulating layer 111*b* in which the first conductor pattern layer 112*a* is embedded, and a fourth conductor pattern layer 112*d* disposed on an opposite side of a side of the third insulating layer 111*c* in which the second conductor pattern layer 112*b* is embedded. The first and second conductor pattern layers 112*a* and 112*b* and the third and fourth conductor pattern layers 112*c* and 112*d* may be electrically connected to the connection pad 162 and the electronic component 120. Since the frame 110 includes a relatively greater number of conductor pattern layers 112*a*, 112*b*, 112*c* and 112*d*, the connection structure 180 may be further simplified. The first and second conductor pattern layers 112*a* and 112*b* and the third and fourth conductor pattern layers 112*c* and 112*d* are electrically connected, through the first to third conductor vias 113*a*, 113*b* and 113*c* passing through the first to third insulating layers 111*a*, 111*b* and 111*c*, respectively.

The first insulating layer 111*a* may have a thickness greater than that of the second insulating layer 111*b* and the third insulating layer 111*c*. The first insulating layer 111*a* may be relatively thick to maintain rigidity, and the second insulating layer 111*b* and the third insulating layer 111*c* may be used to form a relatively larger number of third and fourth conductor pattern layers 112*c* and 112*d*. Similarly, the first conductor via 113*a* passing through the first insulating layer 111*a* may have an average diameter greater than that of the second and third conductor vias 113*b* and 113*c* passing through the second and third insulating layers 111*b* and 111*c*. The first conductor via 113*a* may have a cylindrical shape or an hourglass shape. The second and third conductor vias 113*b* and 113*c* may have a tapered shape in directions opposite to each other. A thickness of each of the first to fourth conductor pattern layers 112*a*, 112*b*, 112*c* and 112*d* may be greater than a thickness of each of the redistribution layers 182.

Other details are substantially the same as those described with reference to FIGS. 9 to 24, 29 and 30, and a detailed description thereof will be omitted.

FIG. 29 is a cross-sectional view schematically illustrating a heterogeneous surface of a package module.

Referring to the drawings, in the case of the package modules 100A, 100B, 100C, 100D and 100E as described above, at least a portion of an outer side surface of the first encapsulant 130 is coplanar with at least a portion of an outer side surface of at least one of the one or more frames 110, on the same level L. To locally retain the frame 110, a cut surface by singulation should be at least composed of the outer side surface of the first encapsulant 130 and the outer side surface of the remaining frame 110. Thus, at least a portion of the outer side surface of the first encapsulant 130 may be coplanar with at least a portion of an outer side surface of at least one of the one or more frames 110, on the same level (L). For example, in the case of the package modules 100A, 100B, 100C, 100D and 100E as described above, at least a portion of outer side surfaces thereof may be a surface of heterogeneous materials of the outer side surface of the first encapsulant 130 and the outer side surface of the insulating layer 111 of the frame 110. On the other hand, in the case of the package modules 100A, 100B, 100C, 100D and 100E as described above, at least a portion of the surface of the outer side surfaces thereof may also have outer side surfaces of the second encapsulant 170 and the insulating layer 141, and the insulating layer 181 and the passivation layer 191, depending on the structure, and depending on a position being viewed. On the other hand, in FIG. 29, descriptions of the metal layer 155 and the like are omitted for convenience of explanation.

FIG. 30 schematically illustrates an effect of a package module.

Referring to the drawing, it is necessary to increase a battery capacity in accordance with the recent enlargement of displays for mobile devices 1100A and 1100B. As the battery capacity increases, the area occupied by a battery 1180 increases. To this end, reduction of the size of a printed circuit board such as a main board 1101 is required. As a result, the area occupied by a module 1150 including PMIC and passive components thereof is continuously decreasing due to a reduction in a mounting area of components. Thus, as at least one of the package modules 100A, 100B, 100C, 100D and 100E as described above may be applied to the module 1150, the size may be significantly reduced, and the narrowed area may also be effectively utilized.

As set forth above, according to an example of the present disclosure, a novel-type package module, in which thinning and miniaturization may be implemented even when a large number of electronic components and semiconductor chips are included, the degree of integration may be increased, and a problem such as undulation or component shift may be prevented, may be provided, thereby improving a yield.

The expressions, 'coplanar' or 'on the same level', in the present disclosure is meant to include not only being located at exactly the same level but also located at approximately the same level as a result of a singulation process or the like, and for example as described above, to include a concept containing a case in which a minute error occurs in the process progress.

The expression, an example, used in this disclosure does not mean the same embodiment, but is provided for emphasizing and explaining different unique features. However, the above-mentioned examples do not exclude being implemented in combination with the features of other examples. For example, although the description in the specific example is not described in another example, it may be understood as an explanation related to another example, unless otherwise described or contradicted by the other example.

The meaning of being connected in the present disclosure encompasses not only a direct connection, but also includes an indirect connection. In addition, the term "electrically connected" means a concept including both a physical connection and non-connection. Further, the first and second expressions are used to distinguish one component from another component and do not limit the order and/or importance of components and the like. In some cases, without departing from the scope of the rights, a first component may be referred to as a second component, and similarly, a second component may also be referred to as a first component.

In the present disclosure, an upper portion, a lower portion, an upper side, a lower side, an upper surface, a lower surface, and the like are determined based on the attached drawings. For example, the connection member is located above the redistribution layer. However, the claims are not limited thereto. In addition, the vertical direction means the above-mentioned upper and lower directions, and the horizontal direction means the direction perpendicular thereto. In this case, the vertical cross-section means a case of cutting into a plane in the vertical direction, and the cross-sectional view shown in the drawings is an example. In addition, the horizontal cross-section means a case of cutting into a plane in the horizontal direction, for example, the plan view shown in the drawing.

The terms used in this disclosure are only used to illustrate an example and are not intended to limit the present disclosure. The singular expressions include plural expressions unless the context clearly dictates otherwise.

What is claimed is:

1. A package module comprising:
    a connection structure including one or more redistribution layers;
    a semiconductor chip disposed on the connection structure and having a connection pad electrically connected to the one or more redistribution layers;
    a plurality of electronic components disposed on the connection structure and electrically connected to the one or more redistribution layers;
    one or more frames disposed on the connection structure and including a plurality of insulating layers and a plurality of conductor vias, the plurality of insulating layers being on the connection structure, the plurality of conductor vias penetrating through the plurality of insulating layers and electrically connected to the one or more redistribution layers;
    a first metal layer covering at least one side surface of the plurality of insulating layers;
    a first encapsulant disposed on the connection structure, and respectively covering at least portions of the plurality of electronic components, the first metal layer, and the one or more frames;
    a second encapsulant covering at least a portion of each of the semiconductor chip and the first encapsulant; and
    a second metal layer disposed directly between the first encapsulant and the second encapsulant,
    wherein the first metal layer has an outer side surface exposed to the outside of the package module, a first side surface connected to the outer side surface, and a second side surface opposite to the first side surface,
    wherein one of the plurality of insulating layers has an outer side surface which is coplanar with the outer side surface of the first metal layer and a side surface which is in contact with the first side surface of the first metal layer, and
    wherein the first encapsulant has an outer side surface which is coplanar with the outer side surface of the first metal layer and a side surface which is in contact with the second side surface of the first metal layer.

2. The package module of claim 1, wherein one of the plurality of insulating layers is disposed between the plurality of electronic components.

3. The package module of claim 1,
    wherein at least a portion of the outer side surface of the first encapsulant is coplanar with an outer side surface of the second encapsulant.

4. The package module of claim 3, further comprising a penetration portion penetrating through the first encapsulant,
    wherein the semiconductor chip is disposed in the penetration portion of the first encapsulant, and
    the second encapsulant fills at least a portion of the penetration portion.

5. The package module of claim 4, wherein the second metal layer is disposed on an inner wall of the penetration portion and extending to an upper surface and a lower surface of the first encapsulant.

6. The package module of claim 5, further comprising:
    a backside metal layer disposed on the second encapsulant;
    a first metal via penetrating through the first and second encapsulants, and connecting the backside metal layer to a first metal layer; and
    a second metal via penetrating through the second encapsulant and connecting the backside metal layer to the second metal layer.

7. The package module of claim 4, further comprising a plurality of conductor pattern layers electrically connected to each other and disposed in the plurality of insulating layers,
    wherein the plurality of conductor pattern layers are electrically connected to the one or more redistribution layers.

8. The package module of claim 7, further comprising:
    a backside conductor pattern layer disposed on the second encapsulant; and
    a backside conductor via penetrating through the first and second encapsulants and electrically connecting the backside conductor pattern layer to the plurality of conductor pattern layers.

9. The package module of claim 7, wherein the one or more frames comprises a first insulating layer, a first conductor pattern layer embedded in the first insulating layer in such a manner that one surface of the first conductor pattern layer is exposed to the first insulating layer, a second conductor pattern layer disposed on a side of the first insulating layer, opposing a side of the first insulating layer, in which the first conductor pattern layer is embedded, a second insulating layer disposed on the side of the first insulating layer, opposing the side of the first insulating layer, in which the first conductor pattern layer is embedded, the second insulating layer covering the second conductor pattern layer, and a third conductor pattern layer disposed on a side of the second insulating layer, opposing a side of the second insulating layer, in which the second conductor pattern layer is embedded, wherein the plurality of conductor pattern layers comprise the first to third conductor pattern layers.

10. The package module of claim 7, wherein the one or more frames comprises a first insulating layer, and first and second conductor pattern layers disposed on both surfaces of the first insulating layer, respectively, and the plurality of conductor pattern layers comprise the first and second conductor pattern layers.

11. The package module of claim 10, wherein the one or more frames further comprises second and third insulating layers disposed on both surfaces of the first insulating layer to cover the first and second conductor pattern layers, respectively, a third conductor pattern layer disposed on an opposite side of a side of a second insulating layer in which a first conductor pattern layer is embedded, and a fourth conductor pattern layer disposed on an opposite side of a side of the third insulating layer in which a second conductor pattern layer is embedded, and the plurality of conductor pattern layers comprise the first to fourth conductor pattern layers.

12. The package module of claim 1, further comprising:
a wiring member disposed on a side of each of the plurality of electronic components, facing the connection structure, the wiring member including one or more wiring layers respectively electrically connected to the plurality of electronic components,
wherein the semiconductor chip has an active surface on which the connection pad is disposed and an inactive surface opposing the active surface, the active surface being in contact with the connection structure,
wherein the active surface of the semiconductor chip is located to be lower than a level of a surface of each of the plurality of electronic components in contact with the wiring member, with reference to the inactive surface of the semiconductor chip.

13. The package module of claim 12, wherein the plurality of electronic components comprise at least one of a capacitor and an inductor.

14. A package module, comprising:
a module structure including a plurality of electronic components, a plurality of insulating layers, and a first encapsulant covering at least a portion of each of the plurality of electronic components and each of the plurality of insulating layers;
a semiconductor chip disposed in the module structure and having a connection pad;
a second encapsulant covering at least a portion of side surfaces of the semiconductor chip and the first encapsulant;
a connection structure disposed below the module structure and including one or more redistribution layers electrically connected to the plurality of electronic components and the connection pad;
a first metal layer covering at least one side surface of the plurality of insulating layers; and
a second metal layer disposed directly between the first encapsulant and the second encapsulant,
wherein the first metal layer has an outer side surface exposed to the outside of the package module, a first side surface connected to the outer side surface, and a second side surface opposite to the first side surface, wherein one of the plurality of insulating layers has an outer side surface which is coplanar with the outer side surface of the first metal layer and a side surface which is in contact with the first side surface of the first metal layer, and wherein the first encapsulant has an outer side surface which is coplanar with the outer side surface of the first metal layer and a side surface which is in contact with the second side surface of the first metal layer.

15. The package module of claim 14, wherein at least a portion of the outer side surface of the first encapsulant is coplanar with an outer side surface of the second encapsulant.

16. The package module of claim 14, further comprising a penetration portion penetrating through the first encapsulant, wherein the semiconductor chip is disposed in the penetration portion of the first encapsulant, and the second encapsulant fills at least a portion of the penetration portion.

17. The package module of claim 16,
wherein the second metal layer is disposed on an inner wall of the penetration portion and extending to an upper surface and a lower surface of the first encapsulant.

18. A package module, comprising:
a connection structure;
a module structure disposed on the connection structure, and including a first encapsulant, a plurality of insulating layers, and a plurality of electronic components;
a semiconductor chip disposed on the connection structure and having a connection pad;
a second encapsulant covering at least a portion of each of the module structure and the semiconductor chip and the first encapsulant, and separating the semiconductor chip and the module structure from each other;
a first metal layer covering at least one side surface of the plurality of insulating layers; and
a second metal layer covering inner surfaces of the module structure facing side surfaces of the semiconductor chip and disposed directly between the first encapsulant and the second encapsulant; and
wherein the first metal layer has an outer side surface exposed to the outside of the package module, a first side surface connected to the outer side surface, and a second side surface opposite to the first side surface,
wherein one of the plurality of insulating layers has an outer side surface which is coplanar with the outer side surface of the first metal layer and a side surface which is in contact with the first side surface of the first metal layer,
wherein the first encapsulant has an outer side surface which is coplanar with the outer side surface of the first metal layer and a side surface which is in contact with the second side surface of the first metal layer, and
wherein the second encapsulant has an outer side surface which is coplanar with the outer side surface of the first encapsulant.

19. The package module of claim 18, wherein the second encapsulant is in contact with an upper surface of the first encapsulant.

20. The package module of claim 18, wherein the module structure includes a lower surface facing the connection structure and an upper surface opposing the lower surface thereof, the package module further comprising a metal film covering an upper surface of the second encapsulant and electrically connected to the first and second metal layers.

\* \* \* \* \*